(12) United States Patent
Ahn et al.

(10) Patent No.: US 11,497,126 B2
(45) Date of Patent: Nov. 8, 2022

(54) MULTILAYER WIRING BOARD AND PROBE CARD INCLUDING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 17/087,261

(22) Filed: Nov. 2, 2020

(65) Prior Publication Data

US 2021/0136927 A1 May 6, 2021

(30) Foreign Application Priority Data

Nov. 5, 2019 (KR) .................. 10-2019-0140065
Feb. 6, 2020 (KR) .................. 10-2020-0014273

(51) Int. Cl.
| | | |
|---|---|---|
| H05K 1/00 | (2006.01) |
| H05K 1/02 | (2006.01) |
| H05K 1/03 | (2006.01) |
| H05K 1/05 | (2006.01) |
| H05K 1/11 | (2006.01) |
| H05K 1/16 | (2006.01) |
| H05K 3/36 | (2006.01) |
| H05K 3/40 | (2006.01) |
| H01L 21/00 | (2006.01) |
| H01L 21/50 | (2006.01) |
| H01L 23/14 | (2006.01) |
| H01L 23/15 | (2006.01) |
| H01L 23/48 | (2006.01) |
| H01L 23/58 | (2006.01) |
| H01L 23/498 | (2006.01) |
| H05K 3/46 | (2006.01) |

(52) U.S. Cl.
CPC .......... *H05K 3/467* (2013.01); *H05K 1/0306* (2013.01); *H05K 3/4629* (2013.01); *H05K 2201/096* (2013.01); *H05K 2201/10378* (2013.01); *H05K 2203/1126* (2013.01)

(58) Field of Classification Search
CPC .. H05K 1/00; H05K 1/02; H05K 1/03; H05K 1/05; H05K 1/11; H05K 1/16; H05K 1/114; H05K 3/36; H05K 3/40; H05K 3/445; H01L 21/00; H01L 21/50
USPC ........ 174/262, 252, 255, 260, 261; 361/523, 361/793; 257/79, 690, 692, 737
See application file for complete search history.

(56) References Cited

U.S. PATENT DOCUMENTS

| | | | | |
|---|---|---|---|---|
| 4,153,988 A | * | 5/1979 | Doo .................. | H01L 23/642 29/842 |
| 10,940,671 B2 | * | 3/2021 | Meyer ................ | H05K 1/0201 |
| 2002/0167013 A1 | * | 11/2002 | Iwasaki .................. | G02B 6/34 257/79 |

(Continued)

FOREIGN PATENT DOCUMENTS

| | | |
|---|---|---|
| JP | 5122935 B2 | 1/2013 |
| JP | 2019012758 A | 1/2019 |

(Continued)

*Primary Examiner* — Xiaoliang Chen

(57) ABSTRACT

Proposed are a multilayer wiring board having both durability and chemical resistance, and a probe card including the same.

9 Claims, 10 Drawing Sheets

(56) References Cited

U.S. PATENT DOCUMENTS

| | | | | |
|---|---|---|---|---|
| 2004/0016570 | A1* | 1/2004 | Yamamoto | H05K 1/114 |
| | | | | 174/250 |
| 2004/0047112 | A1* | 3/2004 | Yoshida | H01G 11/48 |
| | | | | 361/523 |
| 2004/0130877 | A1* | 7/2004 | Okubora | H01L 23/145 |
| | | | | 257/E23.021 |
| 2007/0074900 | A1* | 4/2007 | Lee | H05K 1/185 |
| | | | | 257/E23.178 |
| 2008/0023819 | A1* | 1/2008 | Chia | H01L 23/5389 |
| | | | | 257/692 |
| 2008/0164597 | A1* | 7/2008 | Hsu | H01L 24/19 |
| | | | | 257/690 |
| 2008/0185704 | A1* | 8/2008 | Hsu | H01L 24/19 |
| | | | | 257/690 |
| 2011/0012252 | A1* | 1/2011 | Gao | H01L 25/50 |
| | | | | 257/714 |
| 2011/0042130 | A1* | 2/2011 | Lim | H05K 3/4641 |
| | | | | 29/850 |
| 2013/0048350 | A1* | 2/2013 | Horiuchi | H05K 1/0287 |
| | | | | 174/255 |
| 2013/0200516 | A1* | 8/2013 | Nakatani | H01L 23/15 |
| | | | | 257/737 |
| 2013/0319734 | A1* | 12/2013 | Shin | H01L 23/49827 |
| | | | | 427/97.8 |
| 2014/0041906 | A1* | 2/2014 | Kang | H05K 3/445 |
| | | | | 29/852 |
| 2014/0117539 | A1* | 5/2014 | Karasawa | H01L 23/15 |
| | | | | 257/737 |

FOREIGN PATENT DOCUMENTS

| | | |
|---|---|---|
| KR | 1020090027353 A | 3/2009 |
| KR | 1020090109313 A | 10/2009 |
| KR | 1020170139321 A | 12/2017 |

* cited by examiner

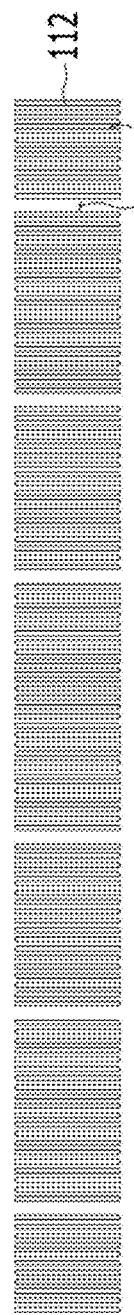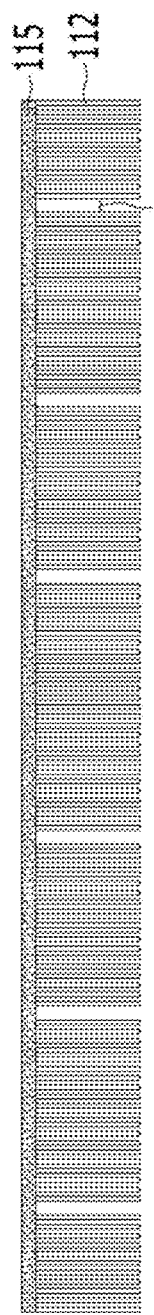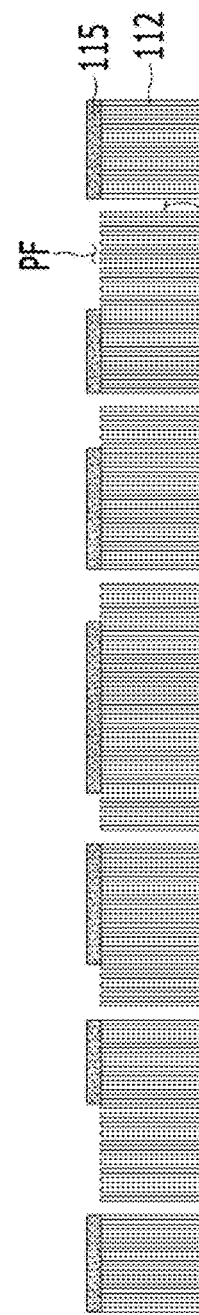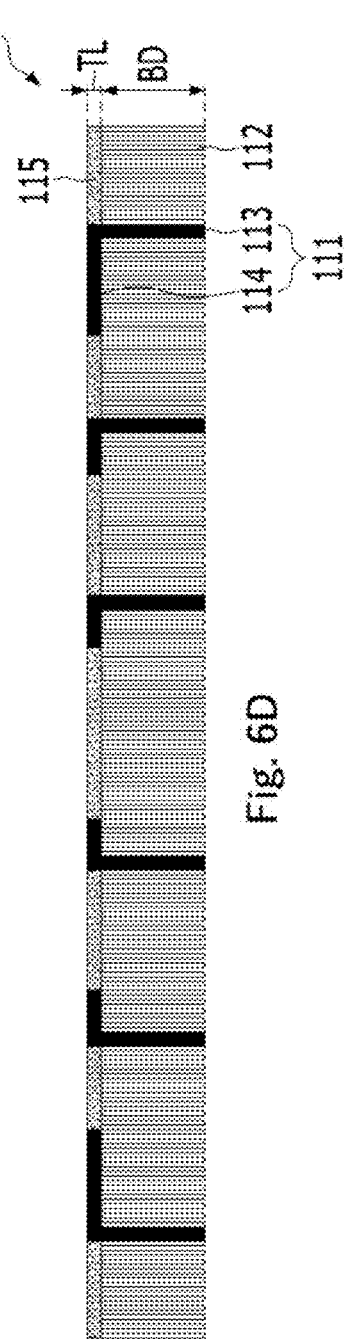

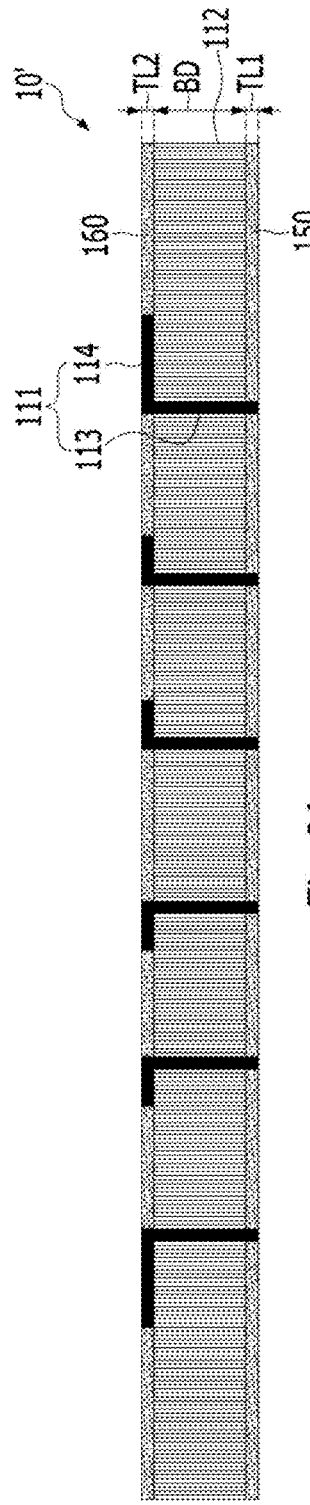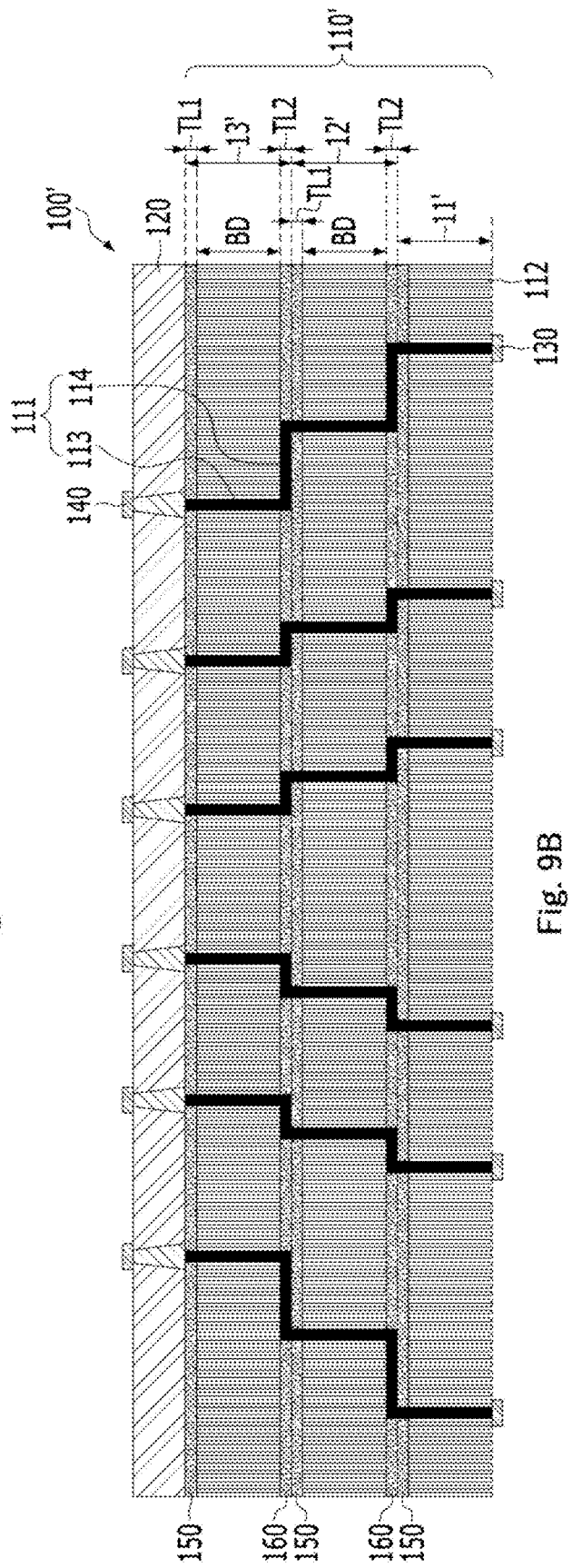

MULTILAYER WIRING BOARD AND PROBE CARD INCLUDING SAME

CROSS REFERENCE TO RELATED APPLICATION

The present application claims priority to Korean Patent Application No. 10-2019-0140065, filed Nov. 5, 2019, and Korean Patent Application No. 10-2020-0014273, filed Feb. 6, 2020, the entire contents of which is incorporated herein for all purposes by this reference.

BACKGROUND OF THE INVENTION

Field of the Invention

The present disclosure relates to a multilayer wiring board made of different materials, and a probe card including the same.

Description of the Related Art

With the recent trend toward miniaturization of semiconductor devices, the size and pitch of electrodes of the semiconductor device have become finer, and this has led to a demand for reducing the thickness of probes of a probe card. In order to compensate for a difference in pitch between fine-pitch probes and a printed circuit board (PCB) substrate, the probe card may include a wiring board between the probes and the PCB substrate.

The wiring board includes through-holes for providing wiring therein. As the pitch of the probes becomes finer, there is also a demand for making the pitch of the through-holes of the wiring board fine.

Conventional wiring boards are mainly made of sintered alumina or sintered mullite having high mechanical strength.

A wiring board made of a sintered ceramic material may be manufactured by the following process. First, a ceramic green sheet may be manufactured by preparing alumina powder or mullite powder. Then, a process of forming through-holes may be performed. In this case, the through-holes may be formed by a machining method using a laser or a drill. Then, a process of forming a wiring with a conductor paste may be performed.

A plurality of ceramic green sheets may be provided by repeatedly performing the above process. The plurality of green sheets may be stacked, followed by sintering at a high temperature in a range of equal to or greater than 1350° C. to equal to or less than 1600° C. to form a sintered ceramic wiring board.

As described above, the machining method using the laser or the drill may be used to form the through-holes in the ceramic green sheet.

However, the machining method has limitations in realizing a fine pitch of the through-holes because the through-holes have to be formed in consideration of mechanical errors. Therefore, the sintered ceramic wiring board has a problem in that it is difficult to provide fine-pitch through-holes.

In addition, the sintered ceramic wiring board is manufactured through a high-temperature firing process in the range of equal to or greater than 1350° C. to equal to or less than 1600° C. Therefore, a material having a high melting point (e.g., molybdenum (Mo), tungsten (W)) is required as a material of a wire provided in the wiring board. This is because a wiring made of a material having a low melting point melts at a temperature lower than the temperature of the high-temperature firing process and is thus not plasticized.

However, a wiring made of a material having a high melting point may be increased in wiring resistance due to its high resistance. Consequently, there is a problem of deteriorating an electrical signal propagation function of the wiring board.

Meanwhile, an example of a probe card having a wiring board made of an anodic oxide film is disclosed in Korean Patent Application Publication No. 10-2017-0139321 (hereinafter referred to as 'Patent Document 2').

Patent Document 2 may be configured to include a plurality of unit anodic oxide film sheets, an anisotropic conductive paste, and probes. In Patent Document 2, the stacked plurality of unit anodic oxide film sheets may be joined to each other by the anisotropic conductive paste, and the probes may be electrically connected to each other by conductors provided inside the unit anodic oxide film sheets.

In a probe card (specifically, a micro-electro-mechanical system (MEMS) probe card), probes may be provided by performing a MEMS process on a side of the probe card where a connection pad electrically connected to the probes is provided. In detail, in order to provide probes, a masking material layer may be provided on a connection pad and patterned through a photoresist process so that a top surface of the connection pad is exposed, and then a metal material may be provided at a patterned position. Thereafter, a seed layer may be deposited to provide a masking material layer thereon and patterned, and then a metal material may be charged in a patterned position, which process may be repeated. Then, an etching process may be performed using an alkaline solution on the remaining portions except for the metal material.

As described above, in the case of a MEMS probe card, a process of forming probes on a connection pad may be performed so that the connection pad and the probe may be joined to each other. In this case, when a wiring board made of only an anodic oxide film is provided, there may arise a problem in which the wiring board is dissolved by an alkaline solution in the process of removing a masking material layer and a seed layer existing around a metal material using the alkaline solution.

Because the anodic oxide film is dissolved by an alkaline solution, the anodic oxide film may be relatively vulnerable to a process of forming and joining probes directly on a connection pad as in the case of the MEMS probe card.

Meanwhile, a wiring board made of a sintered ceramic material may be provided. The sintered ceramic material may be more advantageous in terms of chemical resistance to alkaline solutions.

As described above, in the related art, since the wiring board is made of one of the anodic oxide film and the sintered ceramic material, it is impossible to simultaneously utilize the advantages of the above materials. This causes problems due to the disadvantages of each material.

Accordingly, the applicant of the present disclosure has proposed a multilayer wiring board that was not considered in the related arts.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Japanese Patent No. 5122935
(Patent document 2) Korean Patent Application Publication No. 10-2017-0139321

SUMMARY OF THE INVENTION

Accordingly, the present disclosure has been made keeping in mind the above problems occurring in the related art, and an objective of the present disclosure is to provide a multilayer wiring board capable of realizing a fine pitch of through-holes and rapidly performing an electrical signal propagation function.

Another objective of the present disclosure is to provide a multilayer wiring board having excellent durability and chemical resistance by joining wiring boards of different materials, and provide a probe card including the same.

In order to achieve the above objectives, according to one aspect of the present disclosure, there is provided a multilayer wiring board, including a multilayer part including: a first wiring layer made of an anodic oxide film and having a first wiring; and a second wiring layer having a second wiring electrically connected to the first wiring, the second wiring layer being made of a different material from that of the first wiring layer and being provided on at least a side of the first wiring layer.

Furthermore, a thin film layer may be provided on at least one surface of the first wiring layer.

Furthermore, the first wiring layer may be configured such that unit anodic oxide film layers are stacked from top to bottom and joined to each other by a junction layer.

Furthermore, the different material may be a sintered ceramic material.

Furthermore, the different material may be a resin material.

Furthermore, a plurality of multilayer parts may be provided and joined to each other from top to bottom by a junction layer.

Furthermore, the multilayer wiring board may further include a third wiring layer provided on at least one side of the first wiring layer and made of a different material from those of the first wiring layer and the second wiring layer.

According to another aspect of the present disclosure, there is provided a multilayer wiring board, including: an anodic oxide film wiring board made of an anodic oxide film and having a first wiring; and a sintered ceramic wiring board made of a sintered ceramic material, having a second wiring electrically connected to the first wiring, and joined to the anodic oxide film wiring board so that the sintered ceramic wiring board and the anodic oxide film wiring board are joined to each other from top to bottom.

Furthermore, the anodic oxide film wiring board may be formed by stacking a plurality of unit anodic oxide film wiring boards from top to bottom, each of the unit anodic oxide film wiring boards including a body part having a vertical wiring provided in a first through-hole, and a top layer part provided on a surface of the body part and having a horizontal wiring and a junction layer provided around the horizontal wiring.

Furthermore, the sintered ceramic wiring board may be a wiring board formed by sintering a ceramic green sheet including alumina powder or mullite powder at high temperature.

Furthermore, each of the first and second wirings may be a low-resistance metal material including Ag, Cu, Au, Pd, and Pt.

Furthermore, the unit anodic oxide film wiring boards may be joined to each other by the junction layer.

Furthermore, the junction layer may be made of a photosensitive material.

Furthermore, the anodic oxide film wiring board may be formed by stacking a plurality of unit anodic oxide film wiring boards from top to bottom, each of the unit anodic oxide film wiring boards including a body part having a vertical wiring provided in a first through-hole, a first top layer part provided on at least one surface of the body part and having a vertical wiring and a first junction layer provided around the vertical wiring, and a second top layer part provided on the other surface of the body part and having a horizontal wiring and a second junction layer provided around the horizontal wiring.

According to still another aspect of the present disclosure, there is provided a multilayer wiring board, including: an anodic oxide film wiring board made of an anodic oxide film and having a first wiring; a sintered ceramic wiring board made of a sintered ceramic material, having a second wiring electrically connected to the first wiring, and joined to the anodic oxide film wiring board so that the sintered ceramic wiring board and the anodic oxide film wiring board are joined to each other from top to bottom; a first connection pad provided under the anodic oxide film wiring board; a second connection pad provided on the sintered ceramic wiring board; and a probe electrically connected to the second connection pad.

The multilayer wiring board according to the present disclosure is provided at a position capable of more effectively exerting the properties of a material constituting each wiring layer. Therefore, the advantages of materials constituting the present disclosure are simultaneously used.

Furthermore, the multilayer wiring board according to the present disclosure provides a structure suitable for providing a low-resistance metal material through a preferred stacked structure. Therefore, the present disclosure exhibits excellent effects in terms of electrical signal propagation during an electrical test.

Furthermore, the present disclosure has the advantages of preventing thermal deformation of the anodic oxide film, realizing a fine pitch of the through-holes, durability due to a structure having excellent joining strength, and chemical resistance of the sintered ceramic material. Furthermore, when each of the wiring boards of different materials that are joined to each other is formed in a structure suitable for providing a low-resistance metal material and is used for an electrical test, the wiring boards are increased in reliability in terms of electric signal propagation.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 6A, 6B, 6C, and 6D are views schematically illustrating a process of manufacturing a unit anodic oxide film wiring board according to the present disclosure;

FIGS. 9A and 9B are views schematically illustrating a multilayer wiring board according to a fifth embodiment of the present disclosure.

DETAILED DESCRIPTION OF THE INVENTION

Figure 1:
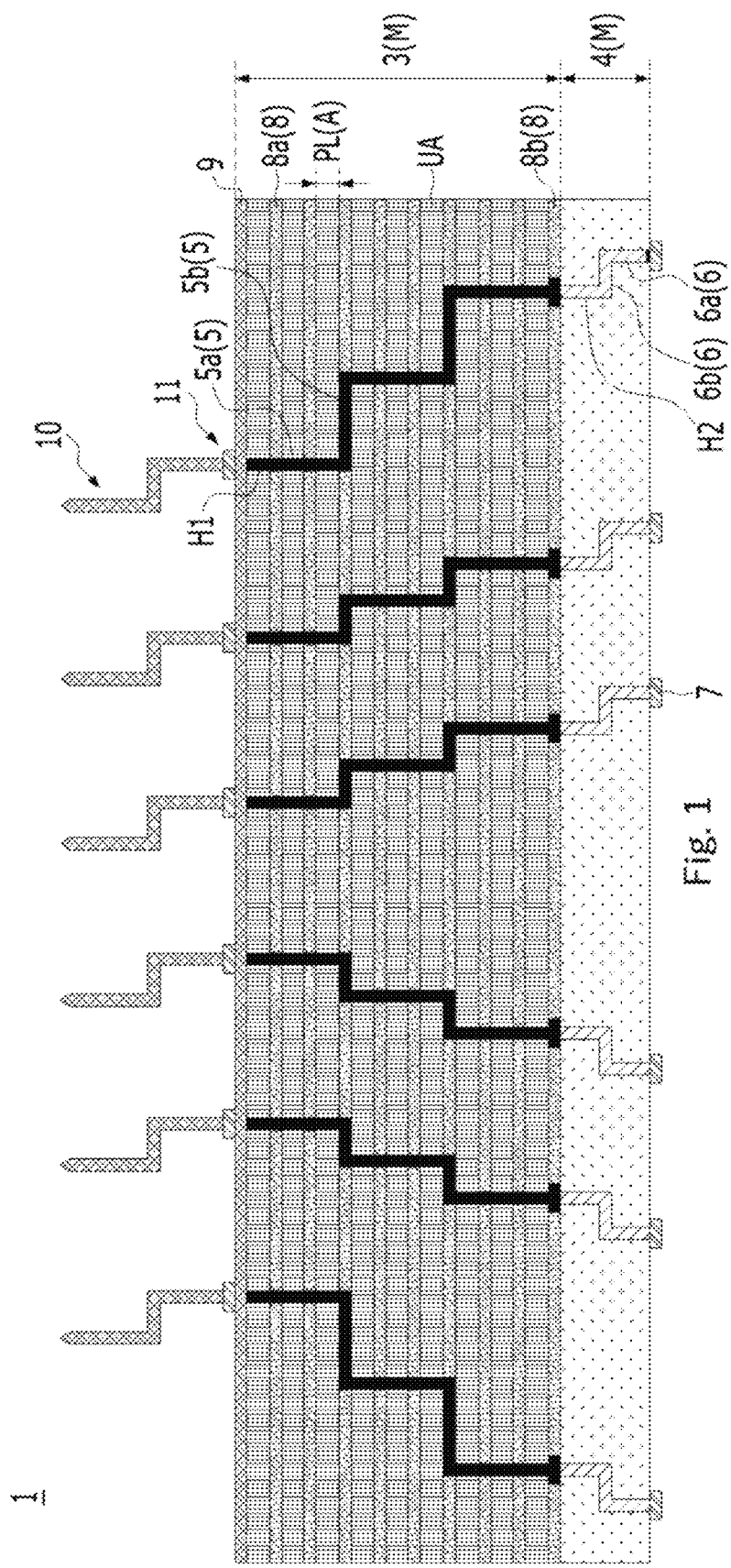
FIG. 1 is a view illustrating a multilayer wiring board according to a first embodiment of the present disclosure.

Contents of the description below merely exemplify the principle of the disclosure. Therefore, those of ordinary skill in the art may implement the theory of the disclosure and invent various apparatuses which are included within the concept and the scope of the disclosure even though it is not clearly explained or illustrated in the description. Furthermore, in principle, all the conditional terms and embodiments listed in this description are clearly intended for the purpose of understanding the concept of the disclosure, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the disclosure.

The embodiments of the present disclosure will be described with reference to cross-sectional views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, multilayer wiring boards according to first to third embodiments of the present disclosure will be described with reference to FIG. 1 to FIGS. 4A, 4B, and 4C.

A multilayer wiring board 1 according to the present disclosure may include a multilayer part M including: a first wiring layer 3 made of an anodic oxide film A and having a first wiring 5; and a second wiring layer 4 having a second wiring 6 electrically connected to the first wiring 5, the second wiring layer 4 being made of a different material from that of the first wiring layer 3, and provided on at least a side of the first wiring layer 3.

In this case, the first wiring 5 of the first wiring layer 3 may include a first vertical wiring 5a and a first horizontal wiring 5b provided on at least one surface of the first wiring layer 3 and connected to the first vertical wiring 5a.

The second wiring 6 of the second wiring layer 4 may include a second vertical wiring 6a and a second horizontal wiring 6b provided on at least one surface of the second wiring layer 4 and connected to the second vertical wiring 6a.

The multilayer wiring board 1 according to the present disclosure having such a configuration may be provided on a probe card.

Depending on the structure of installing probes 10 on the multilayer wiring board 1 and the structure of the probes 10, the probe card may be divided into a vertical type probe card, a cantilever type probe card, a MEMS probe card 200.

In the present disclosure, as an example, it will be described that the multilayer wiring board 1 according to the present disclosure is provided on a MEMS probe card in which a process of providing the probes 10 on the multilayer wiring board 1 is performed. Therefore, the multilayer wiring board 1 according to the present disclosure may include the probes 10 by performing a MEMS process on the multilayer wiring board 1.

The multilayer wiring board 1 according to the present disclosure is not limited to being provided on the MEMS probe card, and may be provided as a multilayer wiring board constituting a vertical type probe card and a cantilever type probe card.

Hereinafter, exemplary embodiments of the present disclosure will be described in detail with reference to the accompanying drawings.

FIG. 1 is a view illustrating the multilayer wiring board 1 according to a first embodiment of the present disclosure.

First, a joining structure of the first and second wiring layers 3 and 4 constituting the multilayer wiring board 1 according to the first embodiment will be described in detail with reference to FIG. 1.

As illustrated in FIG. 1, the multilayer wiring board 1 according to the first embodiment may have a structure in which the second wiring layer 4 is provided under the first wiring layer 3. In this case, it is preferable that the first wiring layer 3 is made of the anodic oxide film A, and the second wiring layer 4 made of a different material from that of the first wiring layer 3 is made of a sintered ceramic material.

As illustrated in FIG. 1, the first wiring layer 3 and the second wiring layer 4 may be joined to each other by a junction layer 8.

The junction layer 8 may include an interfacial junction layer 8b for joining the first wiring layer 3 and the second wiring layer 4, and an internal junction layer 8a for joining a unit anodic oxide film layer UA constituting the first wiring layer 3.

In this case, the internal junction layer 8a may function to join respective unit anodic oxide film layers UA made of the same material, and the interfacial junction layer 8b may function to join the first wiring layer 3 and the second wiring layer 4 made of different materials.

The internal junction layer 8a may be provided on at least one of contact surfaces between the unit anodic oxide film layers UA, and the interfacial junction layer 8b may be provided on a surface of at least one of the first and second wiring layers 3 and 4 made of different materials.

As illustrated in FIG. 1, the first wiring layer 3 and the second wiring layer 4 may be joined to each other by the interfacial junction layer 8b. However, the method for joining the first wiring layer 3 and the second wiring layer 4 is not limited thereto, and any known methods for joining layers of different materials may be used.

In the present disclosure, as an example, the interfacial junction layer 8b may be provided to join the first wiring layer 3 made of the anodic oxide film A and the second wiring layer 4 provided therebelow and made of the sintered ceramic material.

The first and second wiring layers 3 and 4 may be joined to each other by the interfacial junction layer 8b to form the multilayer part M having high joining strength.

The material of the interfacial junction layer 8b may be a photosensitive material, and as an example, may be a dry film photoresist (DFR).

Meanwhile, the material of the interfacial junction layer 8b may be a thermosetting resin. In this case, the thermosetting resin may be polyimide resin, polyquinoline resin, polyamideimide resin, epoxy resin, polyphenylene ether resin, fluororesin, or the like.

The first and second wiring layers 3 and 4 may be joined to each other by the junction layer 8 provided on at least one of the surfaces of the first and second wiring layers 3 and 4. In detail, the interfacial junction layer 8b may be provided on at least one of the surfaces of the first and second wiring layers 3 and 4. The surface where the interfacial junction layer 8b is provided may be a surface where the first and second wiring layers 3 and 4 are in contact with each other.

In the present disclosure, as an example, as illustrated in FIG. 1, the interfacial junction layer 8b may be provided on a bottom surface of the first wiring layer 3, and the second wiring layer 4 may be provided under the interfacial junction layer 8b, so that the first and second wiring layers 3 and 4 may be joined to each other by the interfacial junction layer 8b.

As illustrated in FIG. 1, the first horizontal wiring 5b and the interfacial junction layer 8b around the first horizontal wiring 5b may be provided on a surface of the first wiring layer 3. However, the surface structure of the first wiring layer 3 is not limited thereto. For example, the first vertical wiring 5a and the interfacial junction layer 8b around the first vertical wiring 5a may be provided on the surface of the first wiring layer 3.

In other words, the first wiring layer 3 may include the first horizontal wiring 5b or the first vertical wiring 5a as a wiring provided on the same plane as the interfacial junction layer 8b provided on the surface of the first wiring layer 3.

As described above, the first and second wiring layers 3 and 4 may be structured so as to be joined to each other without a gap by the interfacial junction layer 8b provided on the same plane as the first horizontal wiring 5b provided on the bottom surface of the first wiring layer 3. With such a structure, the first and second wiring layers may be prevented from peeling off from each other in joining the first and second wiring layers 3 and 4 made of different materials. Consequently, the multilayer part M may be formed with excellent joining strength, and durability of the multilayer wiring board 1 itself may be increased.

The first wiring layer 3 may be formed in the following configuration and structure.

As illustrated in FIG. 1, the first wiring layer 3 may be made of the anodic oxide film A.

The anodic oxide film A refers to a film formed by anodizing a metal as a base material. A pore refers to a hole formed in the process of forming the anodic oxide film A by anodizing the metal. For example, in a case where the metal as the base material is aluminum (Al) or an aluminum alloy, the anodization of the base material forms an anodic oxide film A consisting of anodized aluminum ($AlO_3$) on the surface of the base material. The anodic oxide film A formed as described above is divided into a barrier layer in which pores are not formed and a porous layer PL in which pores are formed. The barrier layer is positioned on the base material, and the porous layer PL is positioned on the barrier layer. In the base material on which the anodic oxide film A is formed on the surface thereof, when the base material is removed, only the anodic oxide film A remains.

As shown in FIG. 1, the unit anodic oxide film layer UA may be provided in a form including only the porous layer PL, and alternatively, may be provided in a form including both the barrier layer and the porous layer PL.

When the unit anodic oxide film layer UA includes the barrier layer, the barrier layer may be configured to constitute a surface of the first wiring layer 3. Since the barrier layer may not include pores, the density thereof may be relatively high. Therefore, the barrier layer may be configured to constitute an exposed surface of the first wiring layer 3, so that the durability of the multilayer wiring board 1 may be further increased.

The anodic oxide film A has a coefficient of thermal expansion of 2 to 3 ppm/° C. The coefficient of thermal expansion of the anodic oxide film A may be similar to that of a silicon wafer. Therefore, the anodic oxide film A may have little thermal deformation in a high-temperature process, and may also minimize positional misalignment due to its coefficient of thermal expansion that is similar to that of the silicon wafer.

In the present disclosure, since the first wiring layer 3 may be made of the anodic oxide film A as described above, there may be an advantage in that thermal deformation is minimized in a high-temperature process.

As illustrated in FIG. 1, the first wiring layer 3 may have a structure in which unit anodic oxide film layers UA are stacked from top to bottom and joined to each other by the junction layer 8. In this case, the unit anodic oxide film layers UA may be joined to each other by the internal junction layer 8a. Although nine unit anodic oxide film layers UA are illustrated in FIG. 1, the number of the unit anodic oxide film layers UA constituting the first wiring layer 3 is not limited thereto.

Each of the unit anodic oxide film layers UA may be formed by the process of manufacturing the anodic oxide film A described above, and then a first through-hole H1 may be formed in the unit anodic oxide film layer UA.

The first through-hole H1 may be formed by the following process.

First, a process of providing a photosensitive material on at least one surface of the unit anodic oxide film layer UA may be performed. The photosensitive material may be at least partially patterned through a photoresist process. The unit anodic oxide film layer UA may be etched in an area from which the photosensitive material has been removed by patterning. Through this process, first through-holes H1 may be formed in the unit anodic oxide film layer UA.

The first through-holes H1 may have respective inner walls vertically formed in a straight shape. Therefore, the first through-holes H1 may be formed with a fine pitch while maintaining a constant thickness of a partition wall between the first through-holes H1. Consequently, the first wiring layer 3 may have the fine pitch first through-holes H1.

In other words, unlike the related art, in the first wiring layer 3 according to the present disclosure, the anodic oxide film A may be etched with an etching solution, thereby simultaneously forming tens of thousands to hundreds of thousands of first through-holes H1. In addition, the anodic oxide film A around the first through-hole H1 may not be damaged during etching, the first through-holes H1 may be formed with a fine pitch.

The internal junction layer 8a may be provided on at least one surface of the unit anodic oxide film layer UA, so that the unit anodic oxide film layers UA stacked from top to bottom may be joined to each other. The internal junction layer 8a may be the same configuration as that for joining the first and second wiring layers 3 and 4 described above, or may be a different configuration therefrom. In other words, the internal junction layer 8a and the interfacial junction layer 8b constituting the junction layer 8 may be the same configurations or different configurations. In the present disclosure, as an example, it will be described that the internal junction layer 8a and the interfacial junction layer 8b are the same configurations. Therefore, the material of the internal junction layer 8a, which will be described below, may be a material of the interfacial junction layer 8b.

In detail, the material of the internal junction layer 8a may be a photosensitive material, and as an example, may be a dry film photoresist (DFR).

When the internal junction layer 8a is made of the photosensitive material, the internal junction layer 8a may function as a means for forming the first through-holes H1 described above. In detail, the internal junction layer 8a may be provided on at least one surface of the unit anodic oxide film layer UA. Then, at least a part of the internal junction layer 8a may be patterned. Then, the unit anodic oxide film layer UA may be etched in an area from which the photosensitive material has been removed by patterning. Through this process, the first through-holes H1 may be formed in the unit anodic oxide film layer UA.

Then, a process of charging a metal material into each of the first through-holes H1 and into a patterned area may be performed. In this case, the metal material may be a low-resistance metal material including at least one of Au, Ag, and Cu.

Unlike the related art, the unit anodic oxide film layer UA does not require a high-temperature sintering process. Therefore, the unit anodic oxide film layer UA may include a low-resistance metal material in the first through-hole H1 and the patterned area. The low-resistance metal material may be advantageous in improving the propagation speed of an electrical signal due to its low wiring resistance.

By charging the low-resistance metal material into the first through-hole H1, the first vertical wiring 5a may be provided in the unit anodic oxide film layer UA. In addition, by charging the ow-resistance metal material into the patterned area, the first horizontal wiring 5b may be provided in the unit anodic oxide film layer UA. In this case, the first vertical wiring 5a and the first horizontal wiring 5b may be made of the same metal material.

The first wiring layer 3 composed of a stacked structure of the unit anodic oxide film layers UA may include the first wiring 5 composed of the first vertical wiring 5a and the first horizontal wiring 5b. Therefore, the first wiring layer 3 may include the first wiring 5 made of the low-resistance metal material. Consequently, the first embodiment may exert an effect of improving the propagation speed of an electrical signal during an electrical test of a probe card.

Meanwhile, the first vertical wiring 5a and the first horizontal wiring 5b may be formed by charging a conductor paste including metal powder, such as Cu powder, and resin as main components, or molten solder into the first through-hole H1 and the patterned area.

The internal junction layer 8a may remain without removal and function to join the unit anodic oxide film layers UA stacked from top to bottom.

Therefore, the internal junction layer 8a may function as a means for forming the first through-holes H1, and may perform a function of providing a space for forming the first horizontal wiring 5b and a joining function. Therefore, it is preferable that the internal junction layer 8a is configured to have photosensitive properties so as to be patterned through a photoresist process, and to have properties as a joining material.

Meanwhile, the material of the internal junction layer 8a may be a thermosetting resin. In this case, the thermosetting resin may be polyimide resin, polyquinoline resin, polyamideimide resin, epoxy resin, polyphenylene ether resin, fluororesin or the like.

As illustrated in FIG. 1, in the first embodiment, a probe connection pad 11 connected to the probes 10 may be provided on a surface of the first wiring layer 3. Therefore, the first wiring layer 3 may be a configuration in which a process of providing the probes 10 is directly performed.

In addition, the first wiring layer 3 may constitute a top surface of the multilayer wiring board 1. In this case, a thin film layer 9 may be provided on at least one surface of the first wiring layer 3, preferably, on an exposed top surface thereof.

The thin film layer 9 may be formed by repeatedly performing a cycle of adsorbing a precursor on a surface of the first wiring layer 3 where the thin film layer 9 is to be provided, and of supplying a reactant of a different kind from the precursor to form a monoatomic layer through chemical substitution of the precursor with the reactant.

The thin film layer 9 may be composed of a plurality of monoatomic layers, and may be formed to have a predetermined thickness.

The thin film layer 9 may be made of at least one of aluminum oxide ($Al_2O_3$), yttrium oxide ($Y_2O_3$), aluminum nitride (AlN), silicon dioxide ($SiO_2$), silicon nitride ($Si_3N_4$), and silicon carbide (SiC).

The thin film layer 9 may be made of at least one of the above-described materials to have chemical resistance to a specific chemical used in a specific process (e.g., an etching process). This may allow the thin film layer 9 to protect the anodic oxide film A, which may be vulnerable to a specific chemical, from the specific chemical.

As illustrated in FIG. 1, in the first embodiment, the probe connection pad 11 connected to the probes 10 may be provided on a top surface of the thin film layer of the first wiring layer 3.

As described above, the first wiring layer 3 may be a configuration constituting the top surface of the multilayer wiring board 1 and in which the process of providing the probes 10 is directly performed.

Therefore, by providing the thin film layer 9 on the surface of the first wiring layer 3 where the process of providing the probes 10 is directly performed, chemical resistance to a specific chemical used in the process of providing the probes 10.

The probes 10 may be separately manufactured and then connected to the probe connection pad 11 of the multilayer wiring board 1. In this case, the probes 10 may be provided by performing a MEMS process on a side of the multilayer wiring board 1 where the probe connection pad 11 is provided.

The MEMS process may be performed in the following process.

First, in order to provide the probes 10, a masking material layer may be provided on the probe connection pad 11 and patterned through a photoresist process so that a top surface of the probe connection pad 11 is exposed. Then, a metal material may be provided at a patterned position. Thereafter, a seed layer may be deposited to provide a masking material layer thereon and patterned, and then a metal material may be charged in a patterned position, which process may be repeated. Then, an etching process may be performed using an alkaline solution on the remaining portions except for the metal material. Consequently, the probes 10 may be provided on the probe connection pad 11 of the multilayer wiring board 1.

In this case, the thin film layer 9 may be provided on a surface of the first wiring layer 3 where the MEMS process is performed. Because the anodic oxide film A is dissolved by an alkaline solution, the anodic oxide film A may be relatively vulnerable to a process of forming the probes 10 directly on the multilayer wiring board 1.

Therefore, in the first embodiment, by providing the thin film layer 9 on a surface of the multilayer wiring board 1 where the probe connection pad 11 is provided and by providing the probe connection pad 11 thereon, the anodic oxide film A, which is relatively vulnerable to chemicals, may be protected therefrom.

Consequently, the multilayer wiring board 1 may have chemical resistance properties while the first through-holes H1 with a fine pitch may be realized as the pitch of the probes 10 becomes finer.

The second wiring layer 4 made of the sintered ceramic material may be provided under the first wiring layer 3.

The second wiring layer 4 may be a wiring board formed by sintering a ceramic green sheet including alumina powder or mullite powder at high temperature. In this case, the second wiring layer 4 may be manufactured by a method of manufacturing a conventional wiring board made of a sintered ceramic material. The second wiring layer 4 made of the sintered ceramic material may have high mechanical strength.

As illustrated in FIG. 1, the second wiring layer 4 may be configured as the wiring board made of the ceramic green sheet manufactured with alumina powder or mullite powder. In this case, the second wiring layer 4 may be manufactured by a method of manufacturing a conventional sintered ceramic wiring board. The second wiring layer 4 may have higher mechanical strength.

The second wiring layer 4 may be manufactured by the following process.

First, the ceramic green sheet may be manufactured by preparing alumina powder or mullite powder. Then, a second through-hole H2 may be provided in the ceramic green sheet using a machining method using a laser or a drill. Then, a process of forming a wiring with a conductor paste may be performed. A plurality of ceramic green sheets may be provided by repeatedly performing the above process. Then, a pressing force may be applied to the ceramic green sheets in the stacking direction. Therefore, the ceramic green sheets may be subjected to a high-temperature firing process in a state of being compressed and integrated together. The high-temperature firing process may be performed in the range of equal to or greater than 1350° C. to equal to or less than 1600° C. Through the high-temperature firing process, the second wiring layer 4 made of the sintered ceramic material may be manufactured.

The second wiring layer 4 may constitute a bottom surface of the multilayer wiring board 1. In this case, an interposer connection pad 7 may be provided on an exposed surface (specifically, a bottom surface) of the second wiring layer 4 for connection of an interposer (not illustrated) for performing electrical connection between the multilayer wiring board 1 and a PCB substrate.

The second wiring layer 4 may be provided on a side of the multilayer wiring board 1 adjacent to the interposer to form a partial area of a lowermost portion of the multilayer wiring board 1.

In the first embodiment, the second wiring layer 4 joined to a bottom portion of the first wiring layer 3 may be made of a sintered ceramic material having high mechanical strength.

The first wiring layer 3 may impart a property of minimizing thermal deformation to the multilayer wiring board 1 and may allow the multilayer wiring board 1 to have an advantage of being easy to realize a fine pitch of the first through-holes H1, but reinforcement in terms of mechanical strength may be required.

Therefore, in the first embodiment, the second wiring layer 4 joined to the bottom portion of the first wiring layer 3 may be made of a material different from that of the first wiring layer 3. In detail, in the first embodiment, the second wiring layer 4 may be made of the sintered ceramic material having high mechanical strength.

In the first embodiment, since the first and second wiring layers 3 and 4 are joined to each other by the junction layer 8, a high mechanical strength may be formed primarily in terms of structure. In the first embodiment, by configuring the second wiring layer 4 to be made of the sintered ceramic material having high mechanical strength, the mechanical strength of the multilayer wiring board 1 may be more effectively increased.

The multilayer wiring board 1 according to the first embodiment may be advantageously used in terms of easily realizing a fine pitch of the first through-holes H1 and of having high mechanical strength, through a combination of the anodic oxide film A and the sintered ceramic material.

In other words, the multilayer wiring board 1 according to the first embodiment may have an advantage of being easy to realize a low-resistance metal wiring with excellent durability and a fine pitch.

In addition, as an example, the multilayer wiring board 1 according to the first embodiment may be effectively used for testing electrical properties of a non-memory semiconductor.

In detail, the non-memory semiconductor has a high degree of freedom in design patterns. Therefore, the probe connection pad 11 providing electrical connection between the non-memory semiconductor and the multilayer wiring board 1 is required to be rapidly manufactured.

In this case, in the present disclosure, since the probe connection pad 11 may be provided on the first wiring layer 3 made of the anodic oxide film A, the probe connection pad 11 corresponding to a design pattern of the non-memory semiconductor may be rapidly provided.

The anodic oxide film A may allow the first through-holes H1 each of which has the first wiring 5 to be formed simultaneously, and may be rapidly manufactured because the high-temperature sintering process is unnecessary. Therefore, in the present disclosure, the probe connection pad 11 corresponding to a design pattern of the non-memory semiconductor having a high degree of freedom may be efficiently provided. Consequently, the multilayer wiring board 1 according to the first embodiment may be advantageously used to test electrical properties of the non-memory semiconductor having a high degree of freedom in design patterns.

Figure 2:
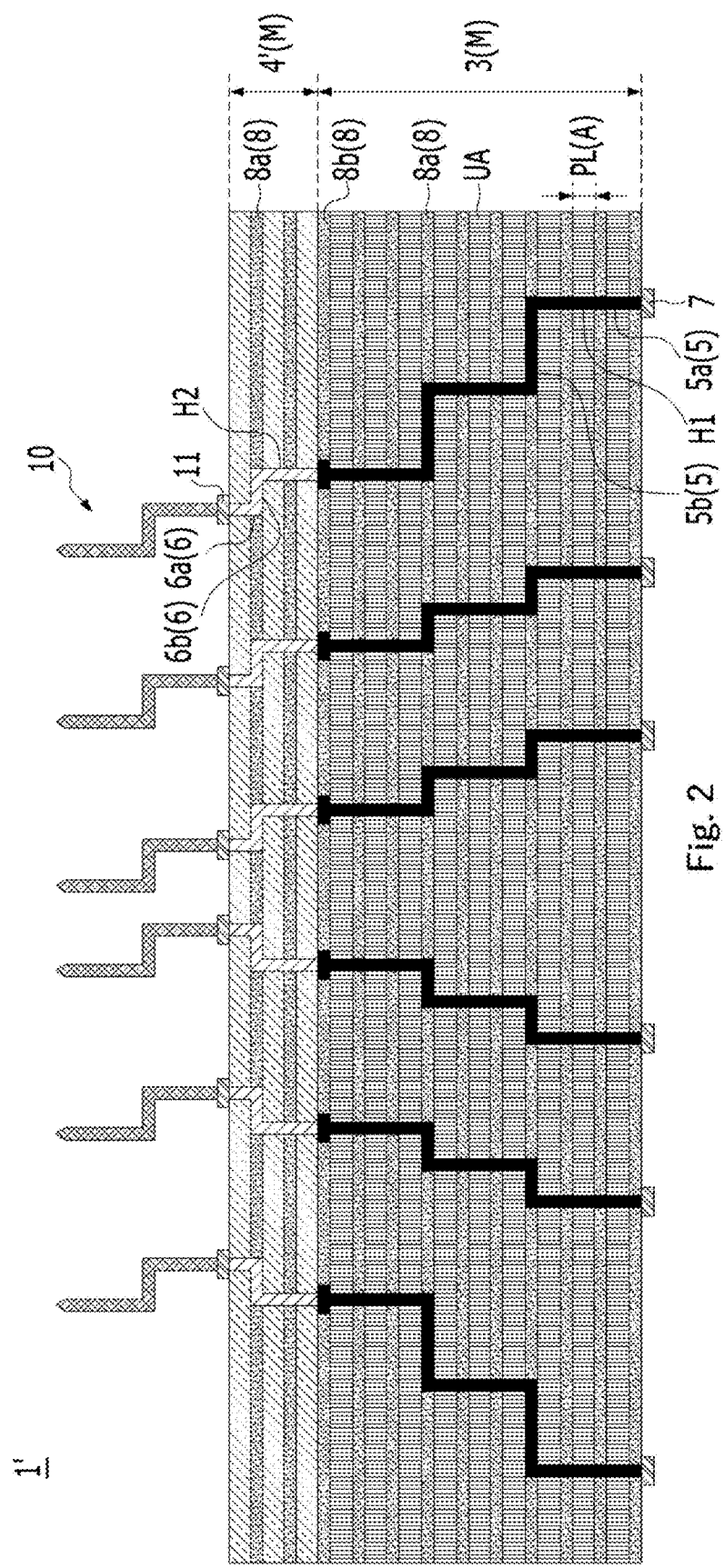
FIG. 2 is a view illustrating a multilayer wiring board according to a second embodiment of the present disclosure.

FIG. 2 is a view illustrating a multilayer wiring board 1' according to a second embodiment of the present disclosure.

The multilayer wiring board 1' according to the second embodiment differs from that according to the first embodiment in that a second wiring layer 4' is made of a resin material. Therefore, the multilayer wiring board 1' according to the second embodiment may include a multilayer part M including a first wiring layer 3 made of an anodic oxide film A, and a second wiring layer 4' made of a resin material and provided on at least a side of the first wiring layer 3.

The second embodiment differs from the first embodiment in material and position of the second wiring layer 4', but the structure for joining the first and second wiring layers 3 and 4' using a junction layer 8 may remain the same as that of the first embodiment.

In detail, the first wiring layer 3 may be formed by joining unit anodic oxide film layers UA using an internal junction layer 8a that joins only unit anodic oxide film layers UA made of the same material.

The second wiring layer 4' may be formed by joining a plurality of wiring boards made of a resin material from top to bottom. In this case, the junction layer 8 for joining of the resin wiring boards may be the internal junction layer 8a.

Since the first and second wiring layers 3 and 4' are made of different materials, the first and second wiring layers 3 and 4' may be joined to each other by an interfacial junction layer 8b. The interfacial junction layer 8b may be provided on a surface of at least one of the first and second wiring layers 3 and 4', i.e., on a surface where the first and second wiring layers 3 and 4' are in contact with each other. In the present disclosure, as an example, as illustrated in FIG. 2, the interfacial junction layer 8b may be provided on a top surface of the first wiring layer 3. Therefore, the first and second wiring layers 3 and 4' may be joined to each other from top to bottom by the interfacial junction layer 8b.

The second embodiment differs from the first embodiment in material and position of the second wiring layer 4', but the structure for joining the first and second wiring layers 3 and 4' using a junction layer 8 may remain the same as that of the first embodiment. Therefore, in the second embodiment, a detailed description of the structure for joining the first and second wiring layers 3 and 4' will be omitted, and a characteristic configuration will be mainly described.

As illustrated in FIG. 2, in the multilayer wiring board 1' according to the second embodiment, in the structure in which the second wiring layer 4' is provided on the first wiring layer 3 made of the anodic oxide film A, it is preferable that the second wiring layer 4' is made of the resin material.

In the second embodiment, as an example, the interfacial junction layer 8b may be provided on the top surface of the first wiring layer 3. The second wiring layer 4' provided on the first wiring layer 3, and the first wiring layer 3 may be joined to each other by the interfacial junction layer 8b.

In the second embodiment, the joining strength may be increased by the joining structure of the first and second wiring layers 3 and 4', so that the durability of a product itself may be secured.

The second wiring layer 4' may be made of the resin material, and specifically, may be made of a thermosetting resin material. In this case, the thermosetting resin may be polyimide resin, polyquinoline resin, polyamideimide resin, epoxy resin, polyphenylene ether resin, fluororesin or the like.

The resin material may be a material that does not require a high-temperature sintering process in forming a stacked structure. Therefore, in the second wiring layer 4'a, a second vertical wiring 6a provided therein may be made of a low-resistance metal material. In addition, in the second wiring layer 4'a, a second horizontal wiring 6b provided to be connected to the second vertical wiring 6a may be made of the same low-resistance metal material.

In the second embodiment, the metal material forming the first and second wirings 5 and 6 may be the low-resistance metal material, thereby exerting an effect of rapidly propagating an electrical signal.

As illustrated in FIG. 2, as an example, the second wiring layer 4' may be formed in a structure in which the wiring boards made of the resin material are stacked from top to bottom and joined to each other by the internal junction layer 8a. Although three resin wiring boards are illustrated in FIG. 2, the number of the resin wiring boards is not limited thereto.

The resin material is a material that facilitates top-to-bottom joining of the wiring boards, and thus may be easy to realize the joining structure thereof.

The second wiring layer 4' made of the resin material may be free from the problem of damage due to a specific chemical. Therefore, in the second embodiment, the second wiring layer 4' may be provided on the first wiring layer 3 so that a surface of the multilayer wiring board 1' where a process of providing probes 10 is directly performed is made of the resin material.

Since the first wiring layer 3 is made of the anodic oxide film A, the first wiring layer 3 may be vulnerable to a specific chemical. Therefore, when the first wiring layer 3 forms the surface of the multilayer wiring board 1' where the process of providing the probes 10 is performed, a separate process capable of imparting chemical resistance to the multilayer wiring board 1' may be required. For example, the first wiring layer 3 may require a process of forming a separate protective layer (e.g., the thin film layer 9 of the first embodiment) on the surface of the first wiring layer 3 where the probe connection pad 11 is provided.

However, in the second embodiment, as illustrated in FIG. 2, the second wiring layer 4' made of the resin material that does not cause damage due to a specific chemical may be provided on the first wiring layer 3 made of the anodic oxide film A.

Therefore, even if the process of providing the probes 10 is directly performed on the multilayer wiring board 1', a problem of damage to a product may not occur.

In addition, in the second embodiment, since a separate process of preventing product damage due to a specific chemical is not required, this may be effective in terms of manufacturing time and process efficiency of the multilayer wiring board 1'.

The second wiring layer 4' made of the resin material may allow forming of a second through-hole H2 through photoresist and etching processes. Therefore, when the second wiring layer 4' is provided to form the surface of the multilayer wiring board 1 where the process of providing the probes 10 is directly performed, it may be easy to realize a fine pitch of second through-holes H2.

The resin material differs from the coefficient of thermal expansion of a silicon wafer, and thus may be relatively vulnerable to positional misalignment due to thermal deformation.

Therefore, in the second embodiment, the first wiring layer 3 made of the anodic oxide film A having a coefficient of thermal expansion similar to that of the silicon wafer may constitute most of the area of the multilayer wiring board 1'. Consequently, the multilayer wiring board 1' may be realized so that the problem of damage due to chemicals on the surface where the process of providing the probes 10 is directly performed does not occur, and thermal deformation is minimized.

As described above, in the second embodiment, through the combination of the first wiring layer 3 made of the anodic oxide film A and the second wiring layer 4' made of the resin material, a wiring may be entirely made of the low-resistance metal material, which may minimize propagation delay of an electrical signal. In addition, in the second embodiment it may be advantageous in realizing a fine pitch because the through-holes for forming vertical wirings are formed through photoresist and etching processes, and a coefficient of thermal expansion may be made similar to that of the silicon wafer (an object to be tested). Therefore, positional misalignment due to the temperature environment of the test atmosphere may be minimized.

As described above, in the structure of the multilayer wiring boards 1 and 1' according to the present disclosure in which each of the second wiring layers 4 and 4' is provided on at least a side of the first wiring layer 3 made of the anodic oxide film A, the second wiring layer 4 and 4' may be made of a material different from that of the first wiring layer 3.

In this case, the second wiring layer 4 may be made of the sintered ceramic material with high mechanical strength which is conventionally used, and may be provided under the first wiring layer 3 to constitute the multilayer wiring board 1.

On the other hand, the second wiring layer 4' may be made of the resin material that is easy to realize a fine pitch and does not require the high-temperature sintering process, and may be provided on the first wiring layer 3 to constitute the multilayer wiring board 1'.

In the first and second embodiments, although it has been described that the positions where the second wiring layers 4 and 4' are provided are differently illustrated depending on the material constituting the second wiring layers 4 and 4', the positions of the second wiring layers 4 and 4' are not limited to those of the first and second embodiments.

However, when the second wiring layer 4 is made of the sintered ceramic material as in the first embodiment, it is preferable that the second wiring layer 4 is provided under the first wiring layer 3 in order to take advantage of the anodic oxide film A that is easy to realize a fine pitch.

On the other hand, when the second wiring layer 4' is made of the resin material, the position of the second wiring layer 4' is not limited, but preferably on the first wiring layer 3.

Since the resin material may be easy to realize a fine pitch and may not require the high-temperature sintering process, the resin material may allow the second wiring 6 to be made of the low-resistance metal material. In addition, in the structure in which the first and second wiring layers 3 and 4' are joined to each other, the resin material may allow for easily realizing top-to-bottom joining of the first and second wiring layers 3 and 4'.

In addition, since the resin material is resistant to damage due to a specific chemical, it is preferable that the resin material constitutes the surface of the multilayer wiring board 1' where the probe connection pad 11 is provided.

Therefore, it is preferable that the second wiring layer 4' made of the resin material is provided on the first wiring layer 3 relatively vulnerable to a specific chemical. With such a structure, the multilayer wiring board 1' may be free from the problem of damage due to a specific chemical even if a process of forming a separate thin film layer 9 is not performed to secure chemical resistance.

In addition, since the second wiring layer 4' made of the resin material does not require the process of forming the separate thin film layer 9, this may be advantageous in terms of an efficient manufacturing process of the multilayer wiring board 1'.

Of course, in order to improve the overall properties of the multilayer wiring board 1', it may be also possible to form the thin film layer 9 of the first embodiment described above on the surface of the multilayer wiring board 1'.

Figure 3:
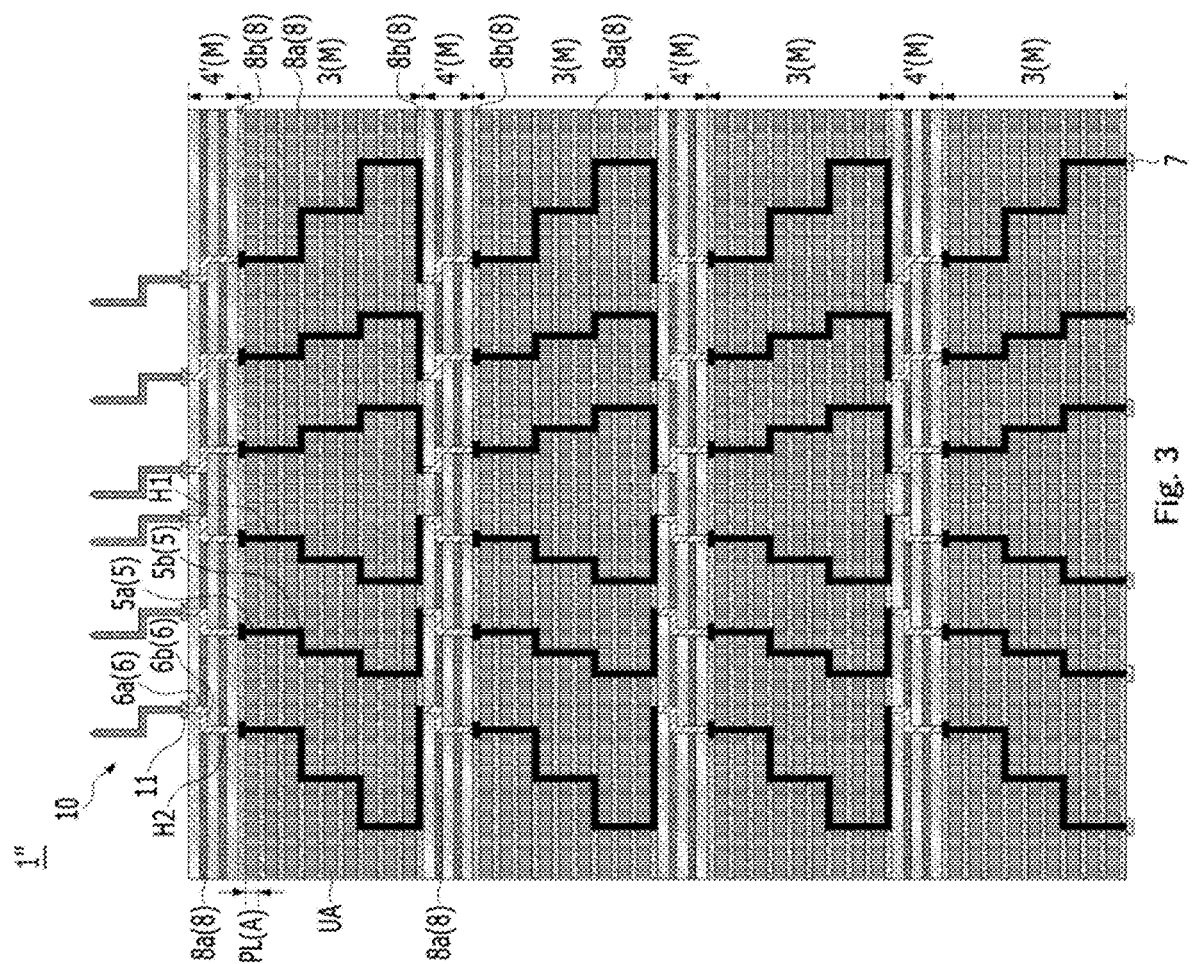
FIG. 3 is a view illustrating a multilayer wiring board according to a third embodiment of the present disclosure.

FIG. 3 is a view illustrating a multilayer wiring board 1" according to a third embodiment of the present disclosure. The third embodiment differs from the first and second embodiments in that a plurality of multilayer parts M each of which includes first and second wiring layers 3 and 4' are provided to constitute the multilayer wiring board 1".

The pitch interval between an interposer connection pad 7 and a probe connection pad 11 of the multilayer wiring board 1" according to the third embodiment may be configured to be finer than that illustrated in FIG. 3. Therefore, the pitch interval of the first and second wirings 5 and 6 may be configured different from that illustrated in FIG. 3.

In the third embodiment, as an example, a plurality of multilayer parts M of the second embodiment may be provided and stacked. Although four multilayer parts M are illustrated in FIG. 3, the number of the multilayer parts M is not limited thereto, and may be larger than four.

The multilayer parts M constituting the third embodiment are not limited thereto. For example, a plurality of multilayer parts M of the first embodiment may be provided and stacked.

The multilayer part M of the third embodiment is not limited in its configuration and structure, as long as it is a multilayer part including a first wiring layer 3 made of an anodic oxide film a material and a second wiring layer 4' made of a different material from that of the first wiring layer 3.

As illustrated in FIG. 3, in the third embodiment, the plurality of multilayer parts M, each including the first wiring layer 3 made of the anodic oxide film A and the second wiring layer 4' provided on the first wiring layer 3 and made of a resin material, may be provided and stacked.

The plurality of multilayer parts M may be joined from top to bottom by a junction layer 8. In this case, the junction layer 8 for joining of the multilayer parts M may be an interfacial junction layer 8b for joining of different materials.

In FIG. 3, as an example, it is illustrated that the multilayer part M is composed of the first wiring layer 3 and the second wiring layer 4' provided on the first wiring layer 3. Therefore, in the third embodiment, a multilayer part M constituting a top surface of the multilayer wiring board 1", and a neighboring multilayer part M thereunder may be provided in the same configuration and structure. In the third embodiment, the second wiring layer 4' of a top multilayer part M and the first wiring layer 3 of a neighboring multilayer part M thereunder may be made of different materials and joined to each other by the interfacial junction layer 8b.

On the other hand, the neighboring multilayer part M under the top multilayer part M may be composed of the first wiring layer 3 and the second wiring layer 4' provided under the first wiring layer 3.

In other words, a multilayer part M except for the multilayer part M constituting a surface of the third embodiment may be configured such that the second wiring layer 4' is provided under the first wiring layer 3. In this case, the multilayer part M constituting the top surface of the third embodiment, and the multilayer part M thereunder may be configured such that the respective first wiring layers 3 are made of the same material, i.e., the anodic oxide film A. In this case, an internal junction layer 8*a* may be used as the junction layer 8 that joins the multilayer parts M.

The third embodiment may be formed in a structure in which the plurality of multilayer parts M are joined to each other by the junction layer 8. Therefore, the third embodiment may be increased in joining strength, and durability of a product itself may be secured.

In addition, since the third embodiment has a structure in which the plurality of multilayer parts M are provided and joined from top to bottom, further increased mechanical strength may be imparted.

In the multilayer wiring board 1″ according to the third embodiment, when the material of the second wiring layer 4′ is the resin material, a surface of the multilayer wiring board 1″ according to the third embodiment may be made of the resin material. The resin material may be a material that allows for easily realizing a fine pitch and does not require a high-temperature sintering process. Therefore, when the second wiring layer 4 made of the resin material constitutes the surface of the multilayer wiring board 1″ according to the third embodiment, a fine pitch of a wiring made of a low-resistance metal material may be realized more effectively.

On the other hand, as another example of the third embodiment, the multilayer wiring board 1″ may include a second wiring layer 4 made of a sintered ceramic material (hereinafter referred to as 'a modification of the third embodiment'). In this case, the modification of the third embodiment may be formed by stacking and joining a plurality of multilayer parts M of the first embodiment.

By the second wiring layer 4 made of the sintered ceramic material constituting each of the multilayer parts M, the modification of the third embodiment may be formed in a structure in which second wiring layers 4 having high mechanical strength are provided between the multilayer parts M. Therefore, the modification of the third embodiment may have excellent durability by having further increased mechanical strength.

In addition, the modification of the third embodiment may be imparted with chemical resistance by a thin film layer 9 provided on a first wiring layer 3 constituting a top surface of the modification of the third embodiment.

Figure 4C:
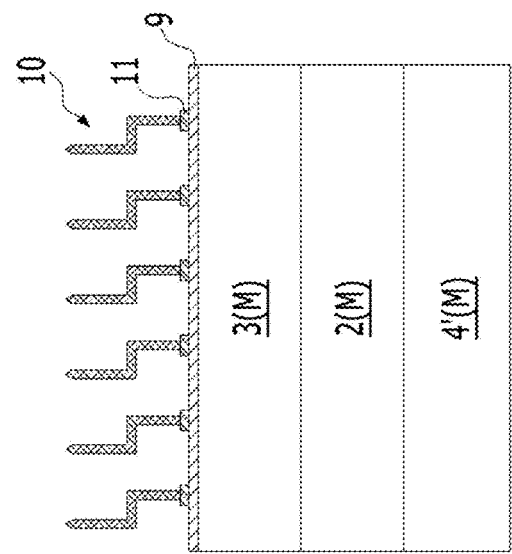
FIGS. 4A, 4B, and 4C are views schematically illustrating various structures of the multilayer wiring board according to the present disclosure.
Figure 4B:
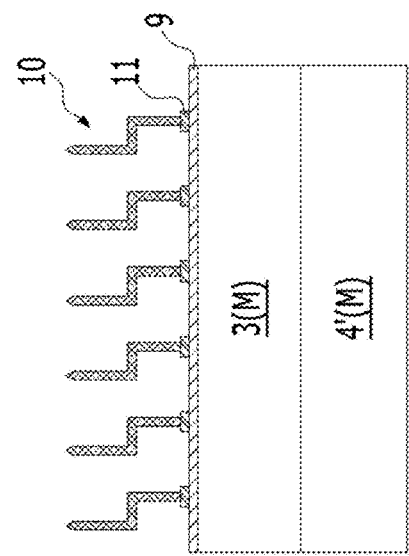
Figure 4A:
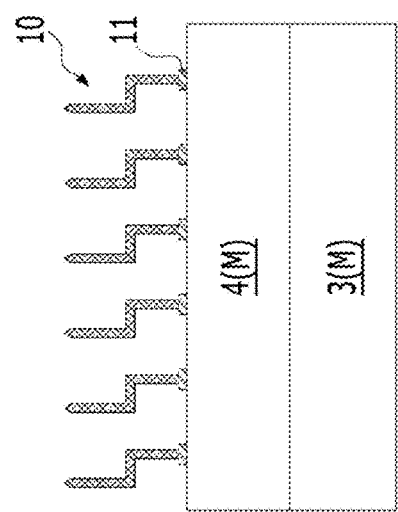

FIGS. 4A, 4B, and 4C are views schematically illustrating various structures of the multilayer wiring board 1 according to the present disclosure.

FIG. 4A is a view illustrating a modification of the first embodiment.

The modification of the first embodiment may include a multilayer part M having the same configuration as that of the first embodiment, but its arrangement structure may be different.

Referring to FIG. 4*a*, the modification of the first embodiment may include the multilayer part M having a structure in which a second wiring layer 4 made of a sintered ceramic material is provided on a first wiring layer 3 made of an anodic oxide film A. The sintered ceramic material has high mechanical strength, as well as may be free from the problem of damage due to a specific chemical.

Therefore, in the modification of the first embodiment, a separate process of imparting chemical resistance to a surface thereof where a probe connection pad 11 is provided may be unnecessary.

FIG. 4B is a view illustrating a first modification of the second embodiment.

The first modification of the second embodiment may include a multilayer part M having the same configuration as that of the second embodiment, but its arrangement structure may be different.

As illustrated in FIG. 4B, the first modification of the second embodiment may include the multilayer part M having a structure in which a second wiring layer 4′ made of a resin material is provided under a first wiring layer 3 made of an anodic oxide film A.

The first wiring layer 3 may be provided to constitute a top surface of the first modification of the second embodiment, so that a probe connection pad 11 may be provided on a surface thereof. In this case, a process of providing probes 10 may be directly performed on the surface of the first wiring layer 3 where the probe connection pad 11 is provided. Therefore, the first wiring layer 3 may have a thin film layer 9 on the surface thereof where the probe connection pad 11 is provided.

Consequently, the first modification of the second embodiment may have an advantage of being easy to provide a wiring (specifically, a first wiring 5) of a low-resistance metal material with a fine pitch, as well as may have chemical resistance to a specific chemical.

FIG. 4C is a view illustrating a second modification of the second embodiment.

As illustrated in FIG. 4C, the second modification of the second embodiment has a difference in that a third wiring layer 2 is further provided in the configuration of the multilayer part M of the first modification of the second embodiment referring to FIG. 4B.

The third wiring layer 2 may be provided on at least a side of a first wiring layer 3 and may be made of a different material from those of the first wiring layer 3 and a second wiring layer 4′. The first to third wiring layers 3, 4′, and 2 may be made of different materials. The second modification of the second embodiment may be composed of a multilayer part M including the first to third wiring layers 3, 4′, and 2 made of different materials, thereby simultaneously having the advantages of each material.

In this case, as an example, the second modification of the second embodiment may have a structure in which the third wiring layer 2 is made of a sintered ceramic material, and is provided between the first wiring layer 3 made of an anodic oxide film A and the second wiring layers 4′ made of a sintered ceramic material.

As illustrated in FIG. 4C, the second modification of the second embodiment may have a structure in which the first wiring layer 3, the third wiring layer 2, and the second wiring layer 4′ are stacked sequentially from a top portion thereof where a probe connection pad 11 is provided. In such a structure, the first wiring layer 3 may have a thin film layer 9 on a surface thereof so as to have chemical resistance.

The stacked structure of the second modification of the second embodiment is not limited thereto. As an example, in another modification of the second embodiment, a second wiring layer 4′ made of a resin material is provided at a top portion thereof where a probe connection pad 11 is provided, and a first wiring layer 3 and a third wiring layer 2 may be sequentially provided thereunder. On the other hand, the second wiring layer 4′ may be provided at the top portion, and the third wiring layer 2 and the first wiring layer 3 may be sequentially provided thereunder.

However, it is preferable that a wiring layer made of an anodic oxide film A or a resin material that allows for easily realizing a relatively fine pitch of a wiring is provided at the top portion where the probe connection pad 11 is provided.

In the second modification of the second embodiment, it has been described that the second wiring layer 4' is made of the resin material, but as another modification, the second wiring layer 4' may be made of the sintered ceramic material. In this case, since the third wiring layer 2 is made of a different material from that of the first and second wiring layers 3 and 4', the third wiring layer 2 may be made of the resin material.

In other words, in the second modification and the other modification of the second embodiment, respective wiring layers (e.g., the first to third wiring layers 3, 4', and 2) may be made of different materials including the anodic oxide film A. In this case, the stacked structure of the respective wiring layers (e.g., the first to third wiring layers 3, 4', and 2) is not limited to any one structure.

The second modification of the second embodiment may provide advantages of high durability, minimization of thermal deformation, and easy realization of a fine pitch of a wiring (specifically, a first wiring 5) made of a low-resistance metal material, through a combination of the anodic oxide film A, the sintered ceramic material, and the resin material.

In the multilayer wiring board 1 according to the present disclosure, the wiring layers (first and second wiring layers 3 and 4 or the first to third wiring layers 3, 4, and 2) constituting the multilayer part M may be made of different materials including the anodic oxide film A.

In this case, the arrangement structure of the respective wiring layers (first and second wiring layers 3 and 4 or the first to third wiring layers 3, 4, and 2) may be configured so as to more effectively exhibit the properties of the materials thereof. Therefore, in the present disclosure, while the advantages of the materials of the multilayer part M may be utilized, different materials used in combination may compensate for the disadvantages of each material.

In addition, in the present disclosure, when the anodic oxide film A is used in combination with the sintered ceramic material or the resin material, a structure suitable for providing a low-resistance metal material may be provided through a preferred stacked structure. Therefore, the present disclosure may exhibit excellent effects in terms of electrical signal propagation during an electrical test.

Hereinafter, multilayer wiring boards according to fourth and fifth embodiments of the present disclosure will be described with reference to FIGS. 5 to 10.

Figure 5:
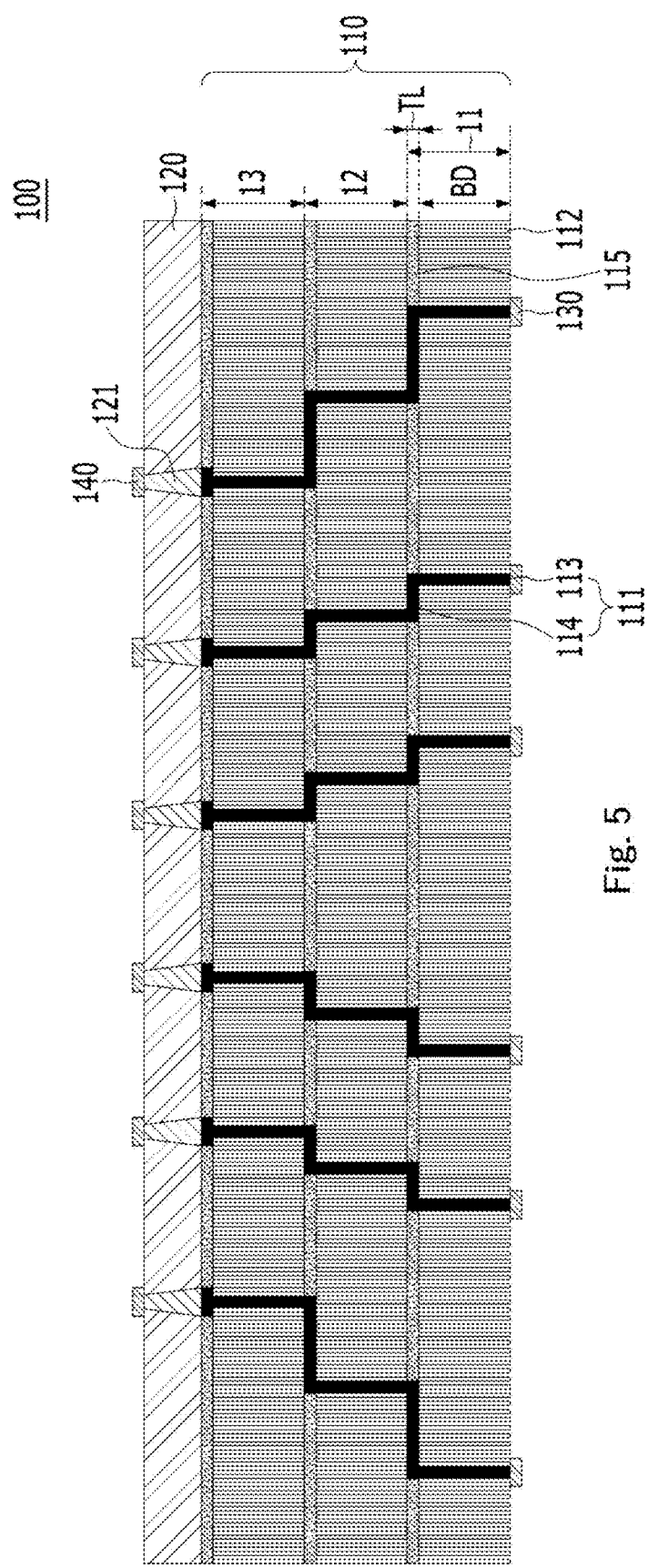
FIG. 5 is a view schematically illustrating a multilayer wiring board according to a fourth embodiment of the present disclosure.

FIG. 5 is a view schematically illustrating a multilayer wiring board 100 according to the fourth embodiment of the present disclosure.

As illustrated in FIG. 5, the multilayer wiring board 100 according to the present disclosure may include: an anodic oxide film wiring board 110 made of an anodic oxide film 112 and including a first wiring 111; and a sintered ceramic wiring board 120 made of a sintered ceramic material, including a second wiring 121 electrically connected to the first wiring 111, and joined to the anodic oxide film wiring board 110 so that the sintered ceramic wiring board 120 and the anodic oxide film wiring board 110 are joined to each other from top to bottom. In this case, the first wiring 111 may include a vertical wiring 113 provided in a first through-hole 112b of the anodic oxide film wiring board 110, and a horizontal wiring 114 provided on a top surface of the anodic oxide film 114 so as to be connected to the vertical wiring 113.

As illustrated in FIG. 5, the multilayer wiring board 100 according to the fourth embodiment may be configured such that the sintered ceramic wiring board 120 is provided on the anodic oxide film wiring board 110 formed by stacking a plurality of unit anodic oxide film wiring boards 10 from top to bottom and joining the same using a junction layer 115. In this case, in the present disclosure, as an example, it will be described that the sintered ceramic wiring board 120 is provided on the anodic oxide film wiring board 110, but depending on the structure in which probes 190 are provided, the sintered ceramic wiring board 120 may be provided under the anodic oxide film wiring board 110.

As illustrated in FIG. 5, the anodic oxide film wiring board 110 and the sintered ceramic wiring board 120 may be joined to each other by a junction layer 115. However, the method for joining the anodic oxide film wiring board 110 and the sintered ceramic wiring board 120 is not limited thereto, and any known methods for joining wiring boards of different materials may be used.

In the present disclosure, as an example, the junction layer 115 may be provided to join the anodic oxide film wiring board 110 and the sintered ceramic wiring board 120, so that the respective wiring boards 110 and 120 may be joined to each other without a gap, thereby obtaining an effect of increasing joining strength.

The material of the junction layer 115 may be a photosensitive material, and as an example, may be a dry film photoresist (DFR).

Meanwhile, the material of the junction layer 115 may be a thermosetting resin. In this case, the thermosetting resin may be polyimide resin, polyquinoline resin, polyamideimide resin, epoxy resin, polyphenylene ether resin, fluororesin or the like.

The junction layer 115 may be provided on a surface of at least one of the anodic oxide film wiring board 110 and the sintered ceramic wiring board 120. The surface of the anodic oxide film wiring board 110 or the sintered ceramic wiring board 120 where the junction layer 115 is provided may be a surface where the anodic oxide film wiring board 110 and the sintered ceramic wiring board 120 are in contact with each other.

However, when the junction layer 115 is provided on the surface of the sintered ceramic wiring board 120, it is preferable that a horizontal wiring is provided on the surface of the sintered ceramic wiring board 120 so as to be connected to the second wiring 121, and the junction layer 115 is provided around the horizontal wiring. This may be to form a structure in which the sintered ceramic wiring board 120 and the anodic oxide film wiring board 110 are joined to each other by the junction layer 115 without a gap. This structure may be formed by forming the junction layer on the surface of the sintered ceramic wiring board 120 having the second wiring 121, by patterning the junction layer at a position corresponding to the second wiring 121, and then forming a horizontal wiring at a patterned position.

In the present disclosure, as illustrated in FIG. 5, as an example, the junction layer 115 may be provided on a top surface of the anodic oxide film wiring board 110. When the junction layer 115 for joining of the sintered ceramic wiring board 120 and the anodic oxide film wiring board 110 is provided on the surface of the anodic oxide film wiring board 110, as illustrated in FIG. 5, the horizontal wiring 114 and the junction layer 115 provided around the horizontal wiring 114 may be provided on the surface of the anodic oxide film wiring board 110.

On the other hand, the vertical wiring 113 and the junction layer 115 provided around the vertical wiring 113 may be provided. In other words, when the junction layer 115 for joining of the sintered ceramic wiring board 120 and the anodic oxide film wiring board 110 is provided on the surface of the anodic oxide film wiring board 110, a wiring provided on the surface of the anodic oxide film wiring board 110 on the same plane as the junction layer 115 may be the vertical wiring 113 or the horizontal wiring 114. In the present disclosure, as an example, it will be described that the horizontal wiring 114 and the junction layer 115 provided around the horizontal wiring 114 are provided on the top surface of the anodic oxide film wiring board 110.

The anodic oxide film wiring board 110 and the sintered ceramic wiring board 120 may be joined to each other by the junction layer 115 that is provided on the same plane as the horizontal wiring 114 provided on the top surface of the anodic oxide film wiring board 110. With a structure in which the horizontal wiring 114 and the junction layer 115 are provided on the same plane on the surface where the anodic oxide film wiring board 110 and the sintered ceramic wiring board 120 are in contact with each other, the respective wiring boards 110 and 120 may be joined to each other without a gap. This structure may prevent the wiring boards 110 and 120 from peeling off from each other in joining the wiring boards 110 and 120 of different materials, thereby obtaining an effect of having excellent joining strength.

The anodic oxide film wiring board 110 and the sintered ceramic wiring board 120 may be individually manufactured and then joined to each other by the junction layer 115.

Figure 7B:
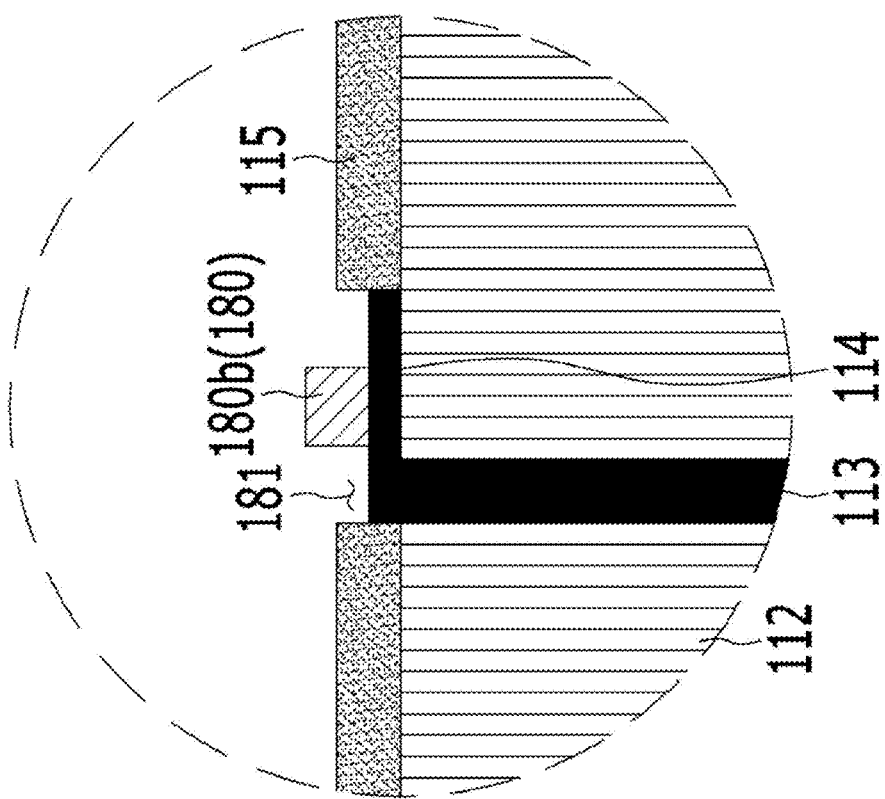
FIGS. 7A and 7B are views illustrating an embodiment of a method for joining a vertical wiring and a horizontal wiring in different layers.
Figure 7A:
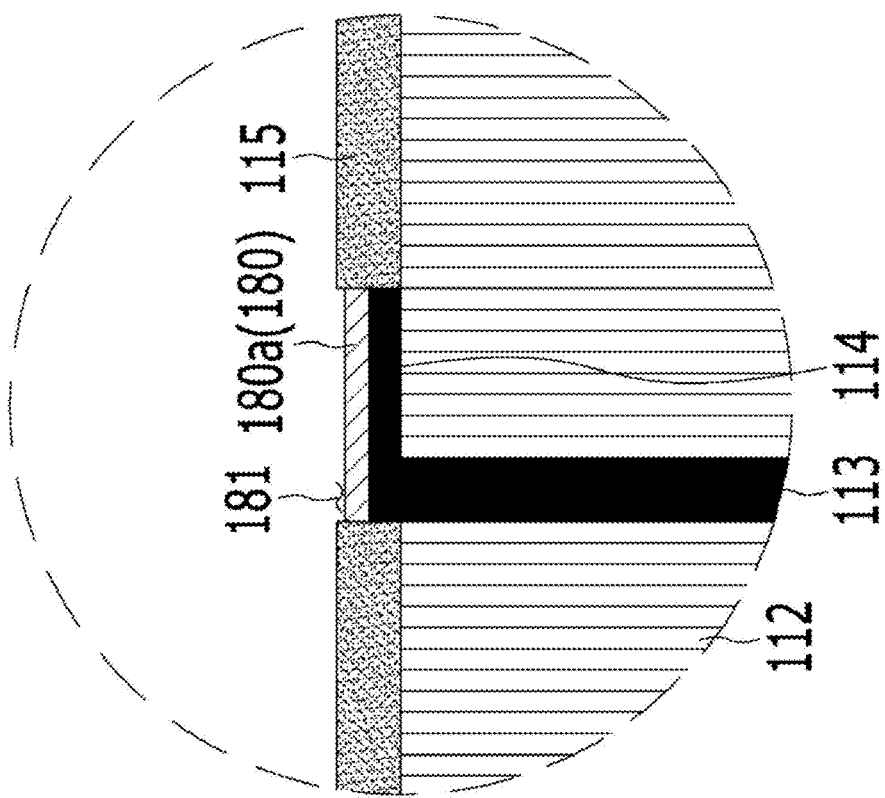
Figure 8A:
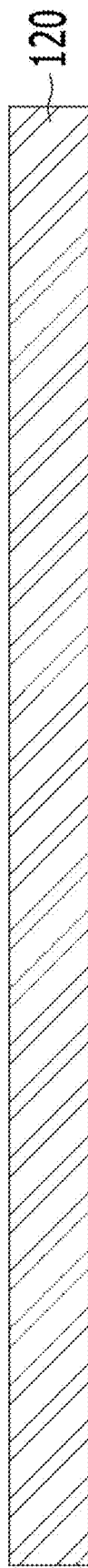
FIGS. 8A, 8B, and 8C are views schematically illustrating a process of manufacturing the sintered ceramic wiring board 120 according to the present disclosure.
Figure 8B:
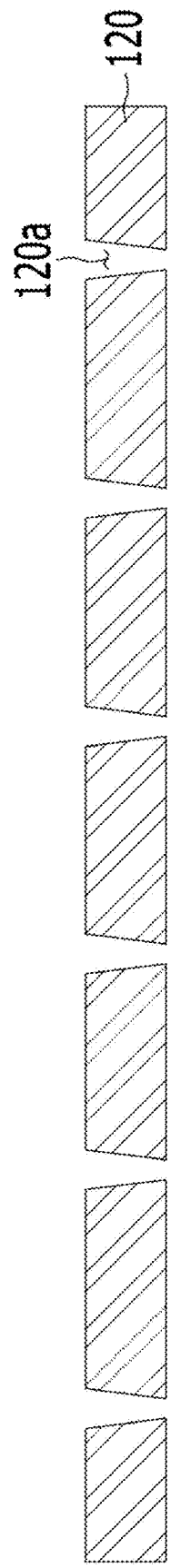
Figure 8C:
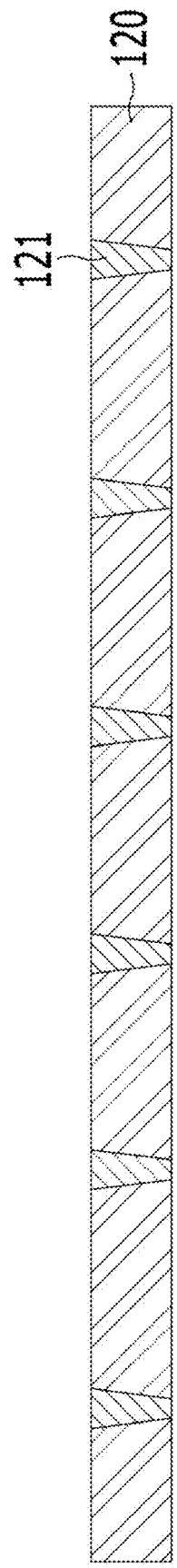

FIGS. 6A, 6B, 6C, and 6D are views schematically illustrating a process of manufacturing a unit anodic oxide film wiring board 10 of the anodic oxide film wiring board 110, FIGS. 7A and 7B are views illustrating an embodiment of a method for joining the vertical wiring 113 and the horizontal wiring 114 of different layers, and FIGS. 8A, 8B, and 8C are views schematically illustrating a process of manufacturing the sintered ceramic wiring board 120.

With reference to FIGS. 6A to 8C, a process of manufacturing each of the wiring boards 110 and 120 and a process of joining the wiring boards 110 and 120 of different materials will be described in detail. Hereinafter, a process of manufacturing the anodic oxide film wiring board 110 will be first described with reference to FIGS. 6A, 6B, 6C, and 6D, but the order of providing the anodic oxide film wiring board 110 and the sintered ceramic wiring board 120 is limited to any one order.

First, as illustrated in FIG. 6A, the anodic oxide film 112 having the first through-hole 112*b* may be provided to manufacture the unit anodic oxide film wiring board 10 constituting the anodic oxide film wiring board 110. The anodic oxide film 112 may have a low coefficient of thermal expansion. This may prevent thermal deformation of the anodic oxide film 112 under a high temperature environment. In the multilayer wiring board 100 according to the present disclosure, the anodic oxide film wiring board 110 formed by stacking the unit anodic oxide film wiring boards 10 may constitute a remaining portion except for a top portion of the multilayer wiring board 100 where the process of providing probes 190 is directly performed. Therefore, the multilayer wiring board 100 according to the present disclosure may be configured such that an area of the top portion where the probes 190 are directly provided is occupied by the sintered ceramic wiring board 120, and a remaining area for compensating for a pitch gap with a PCB substrate terminal is occupied by the anodic oxide film wiring board 110. Therefore, most of the area of the multilayer wiring board 100 is occupied by the anodic oxide film 112, and thus, this may be relatively advantageous in a process under a high temperature atmosphere.

The anodic oxide film 1 before the formation of the first through-hole 112*b* may have a shape including a plurality of regularly arranged pores 112*a* that are formed by anodizing a metal material. A photosensitive material may be provided on a top surface of the anodic oxide film 112. The photosensitive material may be at least partially patterned through a photoresist process. The anodic oxide film 112 may be etched in an area from which the photosensitive material has been removed by patterning. Through this process, the first through-hole 112*b* may be formed in the anodic oxide film 112.

The first through-hole 112*b* formed by an etching process may have an inner wall vertically formed in a straight shape. This may make it possible to easily form a plurality of fine-pitch first through-holes 112*b* in the anodic oxide film 112. The first through-hole 112*b* may be formed to have a larger diameter than each of the pores 112*a* of the anodic oxide film 112.

Then, as illustrated in FIG. 6B, a process of forming the junction layer 115 on the anodic oxide film 112 may be performed. The junction layer 115 for joining of the unit anodic oxide film wiring boards 10 together may be provided on at least a side of the anodic oxide film 1 depending on a structure in which the unit anodic oxide film wiring boards 10 are stacked. In FIG. 6B, as an example, the junction layer 115 may be provided on the anodic oxide film 112. However, when the unit anodic oxide film wiring board 10 is a unit anodic oxide film wiring board 10 that is in direct contact with and joined to the sintered ceramic wiring board 120, it is preferable that the junction layer 115 is provided on a top surface of the unit anodic oxide film wiring board 10.

Then, as illustrated in FIG. 6C, a process of patterning the junction layer 115 may be performed. The junction layer 115 may be patterned to allow the horizontal wiring 114 to be provided on the top surface of the anodic oxide film 112 so as to be connected to the vertical wiring 113. Therefore, it is preferable that a patterned area PF of the junction layer 115 includes a vertical projection area of each of the first through-holes 112*b* in which the vertical wiring 113 is provided. Therefore, as illustrated in FIG. 6C, a structure in which the patterned area PF and the first through-hole 112*b* communicate with each other may be formed.

The patterned area PF may be formed to include the vertical projection area of the first through-hole 112*b*, while including a vertical projection area of a pore 112*a* neighboring to the first through-hole 112*b*. Therefore, a structure in which as a top surface of the pore 112*a* neighboring to the first through-hole 112*b* is exposed, at least a part of the top surface of the anodic oxide film 112 is exposed by the patterned area PF may be formed.

In the present disclosure, as illustrated in FIG. 6C, by forming the patterned area PF by the process of patterning the junction layer 115, a space for forming the horizontal wiring 114 may be provided. After providing the space for forming the horizontal wiring 114 by patterning, the junction layer 115 may remain on the top surface of the anodic oxide film 112 without removal to perform a joining function by an unpatterned area.

As such, the junction layer 115 may simultaneously perform a function of providing the space for forming the horizontal wiring 114 and the joining function. Therefore, it is preferable that the junction layer 115 is configured to have photosensitive properties capable of being patterned by a photoresist process, and to have properties as a joining material capable of performing the joining function.

Then, as illustrated in FIG. 6D, a process of simultaneously charging a metal material into the patterned area PF and the first through-hole 112*b* may be performed. Therefore, the horizontal wiring 114 and the vertical wiring 113 may be formed simultaneously.

The metal material charged into the patterned area PF and the first through-hole 112b may be a low-resistance metal material including Ag, Cu, Au, Pd, and Pt. The low-resistance metal material may increase the propagation speed of an electrical signal due to its low wiring resistance. Consequently, it may be more advantageous in an electrical test of a semiconductor chip using a probe card 200.

As illustrated in FIG. 6D, the vertical wiring 113 and the horizontal wiring 114 may be formed simultaneously.

On the other hand, the vertical wiring 113 and the horizontal wiring art 114 may be formed individually through a process of forming the vertical wiring 113 by forming the first through-hole 112b and then charging the metal material into the first through-hole 112b as described with reference to FIG. 6A, and of forming the horizontal wiring 114 by forming the patterned area PF and then charging the metal material into the patterned area PF as described with reference to FIG. 6C. In other words, the vertical wiring 113 and the horizontal wiring 114 may be simultaneously formed or may be individually formed and then connected to each other. By forming the vertical wiring 113 and the horizontal wiring 114 in the unit anodic oxide film wiring board 10, each first wiring 111 may be provided in the anodic oxide film wiring board 110. Therefore, the first wiring 111 may be the low-resistance metal material including Ag, Cu, Au, Pd, and Pt charged into the patterned area PF and the first through-hole 112b.

Meanwhile, before forming the vertical wiring 113 and the horizontal wiring 114, a conductor paste including metal powder, such as Cu powder, and resin as main components, or a molten solder may be charged into the first through-hole 112b and the patterned area PF. Such a conductor paste or molten solder may function as the vertical wiring 113 and the horizontal wiring 114.

In the present disclosure, by providing the junction layer 115 on at least the side of the anodic oxide film 112 and providing the horizontal wiring 114 in the patterned area PF of the junction layer 115, the unit anodic oxide film wiring board 10 may have a structure in which both the junction layer 115 and the horizontal wiring 114 are provided on the same plane. Such a structure may prevent a gap from existing between the plurality of unit anodic oxide film wiring boards 10 joined to each other by the junction layer 115. Consequently, joining strength of the entire anodic oxide film wiring board 110 composed of the plurality of unit anodic oxide film wiring boards 10 may be excellent.

As shown in FIG. 6D, by the process of forming the vertical wiring 113 and the horizontal wiring 114, the unit anodic oxide film wiring board 10 may include a body part BD having the respective vertical wirings 113, and a top layer part TL having the respective horizontal wirings 114 and the junction layer 115.

In detail, as illustrated in FIG. 6D, the body part BD may be provided by forming the vertical wirings 113 inside the first through-holes 112b by charging the metal material into the first through-holes 112b, the top layer part TL including the horizontal wirings 114 and the junction layer 115 provided around the horizontal wirings 114 may be provided by forming the horizontal wirings 114 by charging the metal material into the respective patterned areas PF.

Therefore, the unit anodic oxide film wiring board 10 may be formed in a structure including the body part BD and the top layer part TL.

The unit anodic oxide film wiring board 10 manufactured through the manufacturing process as described with reference to FIGS. 6A to 6D may be provided in plural by performing the same manufacturing process a plurality of times. Then, the plurality of unit anodic oxide film wiring boards 10 may be joined to each other by the junction layer 115 to form the anodic oxide film wiring board 110.

Therefore, the anodic oxide film wiring board 110 according the present disclosure may be formed by stacking the plurality of unit anodic oxide film wiring boards 10 from top to bottom, each of the unit anodic oxide film wiring boards 10 including the body part BD including the vertical wirings 113 provided in the first through-holes 112b, and the top layer part TL provided on the surface of the body part BD and including the horizontal wirings 114 and the junction layer 115 provided around the horizontal wirings 114.

The plurality of unit anodic oxide film wiring boards 10 may be joined to each other by the junction layer 115 without a gap, by joining of metals (specifically, the vertical wirings 113 and the horizontal wirings 114 provided in different layers) in regions where the junction layer 115 is not provided. As an example, the horizontal wirings 114 of the top layer part TL of one unit anodic oxide film wiring board 10 may be metal-joined to associated ones of the vertical wirings 113 of the body part BD of the other unit anodic oxide film wiring board 10 stacked thereon. Due to the joining of metals, the unit anodic oxide film wiring boards 10 may be joined to each other even in the regions of where the junction layer 115 is not provided. Consequently, joining without a gap between the unit anodic oxide film wiring boards 10 may be realized, and thus the joining strength of the anodic oxide film wiring board 110 may be increased.

In addition, by configuring the unit anodic oxide film wiring board 10 with the anodic oxide film 112 having the pores 112a formed therein, each of the horizontal wirings 114 provided in the top layer part TL, which is a layer in which the junction layer 115 is provided, may be at least partially penetrate into the pores 112a. This may increase a junction area with the result that the joining strength of the anodic oxide film wiring board 110 may be further increased. Referring to FIG. 5 again, as an example, the anodic oxide film wiring board 110 illustrated in FIG. 5 may be composed of first to third unit anodic oxide film wiring boards 11, 12, and 13. In this case, the first to third unit anodic oxide film wiring boards may be stacked in the direction from bottom to top in the drawing. As illustrated in FIG. 5, the horizontal wirings 114 of the first unit anodic oxide film wiring board 11 may penetrate into the pores 112a of the anodic oxide film 112 of the second unit anodic oxide film wiring board 12 at positions corresponding to the horizontal wirings 114. In addition, the horizontal wirings 114 of the second unit anodic oxide film wiring board 12 may penetrate into the pores 112a of the anodic oxide film 112 of the third unit anodic oxide film wiring board 13 at positions corresponding to the horizontal wirings 114. This may provide an anchoring effect for joining the unit anodic oxide film wiring boards 10 to each other and prevent a peeling phenomenon therebetween. Consequently, the joining strength of the anodic oxide film wiring board 110 may be increased and durability thereof may be more excellent.

As a method of joining the vertical wirings 113 and the horizontal wirings 114 provided in different layers of the anodic oxide film wiring board 110, a known metal joining method may be used. As an example, a method of heating and melting a metal material for joining may be used. In this case, as illustrated in FIGS. 7A and 7B, the vertical wiring 113 and the horizontal wiring 114 provided in different layers may be joined to each other by a solder 180 provided in the patterned area PF. In the present disclosure, by patterning the junction layer 115 and then using the junction layer 115 that remains without removal after patterning, a region for providing the horizontal wiring 114 and the solder 180 may be formed.

FIGS. 7A and 7B are views illustrating an embodiment of a method for joining the vertical wiring 113 and the horizontal wiring 114 of different layers. As illustrated in FIGS. 7A and 7B, the solder 180 may be provided in the patterned area PF to join the vertical wiring 113 and the horizontal wiring 114 of different layers to each other. The respective anodic oxide films 112 of the plurality of unit anodic oxide film wiring boards 10 may be joined to each other by the junction layer 115, and the wirings (specifically, the vertical wiring 113 and the horizontal wiring 114 of different layers) may be joined to each other without a gap by the solder 180.

As illustrated in FIG. 7A, the solder 180 may be formed in a shape covering a top surface of the horizontal wiring 114 provided in the patterned area PF. When a cover-shaped solder 180a is provided in the patterned area PF, the horizontal wiring 114 provided in the patterned area PF may be formed to a depth lower than that of the patterned area PF before the solder 180a is provided.

As illustrated in FIG. 7A, the horizontal wiring 114 may be formed to a depth lower than that of the patterned area PF, thereby forming a free space 181 for providing the cover-shaped solder 180a in the patterned area PF. The solder 180a with a shape of covering the horizontal wiring 114 may be provided in the patterned area PF in the free space 181 remaining after the horizontal wiring 114 is formed.

In this case, the cover-shaped solder 180a provided in the patterned area PF may be prevented from overflow due to the junction layer 115 provided around the patterned area PF. This may be because the junction layer 115 performs a dam function so that the solder 180a does not overflow around the patterned area PF.

When the cover-shaped solder 180a is provided in the patterned area PF as described above, the junction layer 115 may function to provide a space in which the horizontal wiring 114 and the solder 180 is provided, and may simultaneously perform a joining function and a function of preventing overflow of the solder 180.

As illustrated in FIG. 7A, when the cover-shaped solder 180a is provided in the patterned area PF, it is preferable that the junction layer 115 is made of a material capable of elastic deformation by thermal compression. Therefore, in the process of joining the unit anodic oxide film wiring boards 10 to each other, as the junction layer 115 is elastically deformed by a height remaining after the cover-shaped solder 180a is provided, the unit anodic oxide film wiring boards 10 may be joined to each other without a gap.

The solder 180 provided in the patterned area PF may be formed in an island shape on the top surface of the horizontal wiring 114. This will be described in detail with reference to FIG. 7B.

As illustrated in FIG. 7B, an island-shaped solder 180b may be provided in the patterned area PF in the free space 181 remaining after the horizontal wiring 114 is formed.

In this case, the free space 181 for providing the solder 180b may be formed by using the junction layer 115 that remains without removal after patterning.

The island-shaped solder 180b may be melted and charged into the free space 181. In this case, the junction layer 115 around the patterned area PF in which the island-shaped solder 180b is provided may perform a function of preventing the island-shaped solder 180b from overflow while melting.

As the vertical wiring 113 and the horizontal wiring 114 of different layers are joined by the island-shaped solder 180b, the unit anodic oxide film wiring boards 10 may be joined to each other without a gap.

FIGS. 8A, 8B, and 8C are views schematically illustrating a process of manufacturing the sintered ceramic wiring board 120 according to the present disclosure.

The sintered ceramic wiring board 120 may be a wiring board formed by sintering a ceramic green sheet including alumina powder or mullite powder at high temperature. A second through-hole 120a may be formed in the sintered ceramic wiring board 120, and a second wiring 121 may be provided in the second through-hole 120a. This will be described in detail with reference to FIGS. 8A, 8B, and 8C.

First, as illustrated in FIG. 8A, the sintered ceramic wiring board 120 may be provided by sintering a ceramic green sheet including alumina powder or mullite powder at high temperature. The ceramic green sheet may be sintered at a high temperature of preferably 1350° C. to 1600° C. in terms of providing a board having high mechanical strength. As an example, when the temperature at which the ceramic green sheet is sintered is 1400° C., the ceramic green sheet illustrated in FIG. 8A may be the sintered ceramic wiring board 120 sintered at 1400° C.

Then, as illustrated in FIG. 8B, second through-holes 120a may be formed. As a method of forming the second through-holes 120a in the sintered ceramic wiring board 120 after high-temperature sintering, a machining method using a laser or a drill is preferably used.

Then, as illustrated in FIG. 8B, a process of forming the second vertical wiring 121 in each of the second through-holes 120a may be performed. A metal material may be charged into the second through-hole 120a. The metal material charged into the second through-hole 120a may be a metal material capable of sintering at a temperature lower than the temperature at which the sintered ceramic wiring board 120 is sintered. In detail, the metal material may be a low-resistance metal material including Ag, Au, Pd, and Pt.

Then, the metal material of the second through-hole 120a may be sintered at a temperature lower than the temperature at which the sintered ceramic wiring board 120 is sintered. The temperature at which the second wiring 121 is formed is preferably 800° C. to 1000° C. By sintering the metal material of the second through-hole 120a at a temperature relatively lower than the temperature at which the sintered ceramic wiring board 120 is sintered, it may be possible for the sintered ceramic wiring board 120 to have the low resistance metal material therein.

Through this process, the second wiring 121 may be formed. The metal material forming the second wiring 121 may be the low-resistance metal material including Ag, Au, Pd, and Pt.

The first wiring 111 and the second wiring 121 of the above-described anodic oxide film wiring board 110 may be made of the same metal material. In other words, the first and second wirings 111 and 121 constituting the multilayer wiring board 100 according to the present disclosure may be the low-resistance metal material including Ag, Au, Pd, and Pt.

Although the anodic oxide film wiring board 110 and the sintered ceramic wiring board 120 are individually manufactured, the wirings (specifically, the first wiring 111 and the second wiring 121) may be made of the same low-resistance metal material. When the wiring boards 110 and 120 are joined to each other to thereby manufacture the multilayer wiring board 100 according to the present disclosure, the first and second wirings 111 and 121 may be formed in an electrically connected structure. Since the first and second wirings 111 and 121 may be made of the same low-resistance metal material, the multilayer wiring board 100 according to the present disclosure may obtain an excellent effect of electrical signal propagation.

Through the manufacturing process as described with reference to FIGS. 8A to 8C, the sintered ceramic wiring board 120 having the respective second wirings 121 in the second through-holes 120a may be manufactured. The sintered ceramic wiring board 120 may have excellent chemical resistance to an alkaline solution by being sintered through a high-temperature sintering process.

In the multilayer wiring board 100 according to the present disclosure, the sintered ceramic wiring board 120 having excellent chemical resistance may be provided on a side thereof where the probes 190 are directly joined. Therefore, the disadvantages of the anodic oxide film wiring board 110, which has relatively low chemical resistance to an alkaline solution while having high joining strength and being advantageous in terms of preventing thermal deformation, may be compensated, so that a multilayer wiring board having chemical resistance may be implemented.

In the present disclosure, after the wiring boards 110 and 120 are individually provided by the process of individually manufacturing the anodic oxide film wiring board 110 and the sintered ceramic wiring board 120, a process of joining the wiring boards 110 and 120 may be performed. In this case, the anodic oxide film wiring board 110 and the sintered ceramic wiring board 120 may be joined to each other by the junction layer 115.

In the process of joining the anodic oxide film wiring board 110 and the sintered ceramic wiring board 120, the anodic oxide film wiring board 110 and the sintered ceramic wiring board 120 may be joined to each other by forming a structure in which the horizontal wirings 114 of a unit a process of anodic oxide film wiring board 10 that is in direct contact with the sintered ceramic wiring board 120 are connected to associated ones of the second wirings 121 of the sintered ceramic wiring board 120.

Referring to FIG. 5, the sintered ceramic wiring board 120 may be provided on the anodic oxide film wiring board 110. The unit anodic oxide film wiring board 10 in direct contact with the sintered ceramic wiring board 120 may be the third unit anodic oxide film wiring board 13. In this case, the sintered ceramic wiring board 120 may be provided on the anodic oxide film wiring board 110, in a structure in which the horizontal wirings 114 of the third unit anodic oxide film wiring board 13 and associated ones of the second wirings 121 of the sintered ceramic wiring board 120 are connected to each other.

Then, a process of joining the anodic oxide film wiring board 110 and the sintered ceramic wiring board 120 by the horizontal wirings 114 provided in the top layer part TL of the third unit anodic oxide film wiring board 13 and by the junction layer 115 provided around the horizontal wirings 114 may be performed. In this case, each of the second wirings 121 of the sintered ceramic wiring board 120 and an associated one of the horizontal wirings 114 of the anodic oxide film wiring board 110 to be joined to the second wirings 121 may be joined to each other without a gap through a joining method using the solder 180 as illustrated in FIGS. 7A and 7B or a suitable metal joining method. A solder 180 for joining the second wiring 121 and the horizontal wiring 114 may be prevented from overflow by the junction layer 115 of the anodic oxide film wiring board 110 providing a space for the solder 180 and thus may effectively join the second wiring 121 and the horizontal wiring 114.

With such a structure, the anodic oxide film wiring board 110 and the sintered ceramic wiring board 120 may be electrically connected to each other in the multilayer wiring board 100. In other words, with a structure in which each of the horizontal wiring 114 of the third unit anodic oxide film wiring board 13 and the second wiring 121 of the sintered ceramic wiring board 120 are connected to each other, electrical connection between the first wiring 111 of the anodic oxide film wiring board 110 and the second wiring 121 of the sintered ceramic wiring board 120 may be realized.

As illustrated in FIG. 5, the multilayer wiring board 100 according the present disclosure may have a structure in which only the top portion thereof where the probes 190 are provided is composed of the sintered ceramic wiring board 120, and the remaining portion thereof is composed of the anodic oxide film wiring board 110. With such a structure, the area of a portion that may be vulnerable to an alkaline solution may be made of a sintered ceramic material having high chemical resistance, and the remaining area may be made of an anodic oxide film that has high joining strength and is advantageous in terms of preventing thermal deformation.

Consequently, it may be possible to realize the multilayer wiring board 100 having a high durability structure with excellent joining strength, while preventing the multilayer wiring board from dissolving by an alkaline solution used when providing the probes 190.

The structure of joining the sintered ceramic wiring board 120 and the anodic oxide film wiring board 110 may be the same as that of joining the unit anodic oxide film wiring board 10 by the junction layer 115. In detail, by forming a structure in which the junction layer 115 and the wirings (specifically, the horizontal wirings 114 or the vertical wirings 113) are provided together on the same plane, the wiring boards 110 and 120 may be joined to each other. When portions where the wiring boards 110 and 120 are joined to each other are the same in structure as the junction layer 115 and the wirings (specifically, the horizontal wirings 114 or the vertical wirings 113) provided together on the same plane, the individually manufactured wiring boards 110 and 120 made of different materials may be joined to each other without a gap.

With such a structure, the multilayer wiring board 100 according to the present disclosure may exhibit an effect of excellent joining strength of the multilayer wiring board 100 itself and increased durability in terms of structure.

In addition, since the multilayer wiring board 100 according to the present disclosure may have the sintered ceramic wiring board 120 on a side thereof where the probes 190 are provided, a probe forming method of providing the probes 190 using a conventional MEMS process may be used.

FIGS. 9A and 9B are views schematically illustrating a multilayer wiring board 100' according to a fifth embodiment of the present disclosure. FIG. 9A is a view schematically illustrating a unit anodic oxide film wiring board 10' constituting the multilayer wiring board 100' according to the fifth embodiment, and FIG. 9B is a view illustrating the multilayer wiring board 100' including the unit anodic oxide film wiring board 10' illustrated in FIG. 9A.

The multilayer wiring board 100' according to the fifth embodiment differs from that according to the first embodiment in that a plurality of unit anodic oxide film wiring boards 10' constituting an anodic oxide film wiring board 110' are joined to each other by first and second junction layers 150 and 160. Hereinbelow, a characteristic configuration different from the fourth embodiment will be mainly described, and a description of the same configuration as the fourth embodiment will be omitted.

As illustrated in FIG. 9A, the unit anodic oxide film wiring board 10' constituting the anodic oxide film wiring board 110' may include an anodic oxide film 112, a vertical wiring 113 provided in a first through-hole 112b of the anodic oxide film 112, a vertical wiring 113 provided on a bottom surface of the anodic oxide film 112, a first junction layer 150 provided around the vertical wiring 113, a horizontal wiring 114 provided on a top surface of the anodic oxide film 112, and a second junction layer 160 provided around the horizontal wiring 114. The first and second junction layers 150 and 160 of the unit anodic oxide film wiring board 10' may be provided on respective surfaces of the anodic oxide film 112. In the present disclosure, as an example, it will be described that the second junction layer 160 is provided on the top surface of the anodic oxide film 112 and the first junction layer 150 is provided on the bottom surface thereof.

In the unit anodic oxide film wiring board 10', the first junction layer 150 may be provided under the anodic oxide film 112 including pores 112a, and then the first junction layer 150 may be patterned to form a first pattered area. Then, a process of forming the first through-hole 112b in the anodic oxide film 112 through each first patterned area may be performed.

Since the first through-hole 112b may be formed by performing etching through the first patterned area, the first through-hole 112b may be formed to have the same diameter as the first patterned area. Therefore, a structure in which the first through-hole 112b and the first patterned area communicate with each other in a straight shape may be formed. In the unit anodic oxide film wiring board 10', the first junction layer 150 may function as a mask for forming the vertical wiring 113 provided in each of the respective first through-holes 112b. In addition, the first junction layer 150 may not be removed from a bottom portion of the anodic oxide film 112 but remain to be used to perform a joining function for joining the plurality of unit anodic oxide film wiring boards 10'. As such, the first junction layer 150 may simultaneously perform a function as a mask for forming the vertical wiring 113 and the joining function.

Then, the second junction layer 160 may be provided on the anodic oxide film 112, and then the second junction layer 160 may be patterned to form a second patterned area. Each second patterned area may be formed to include the first through-hole 112b and a vertical projection area of the first patterned area. Therefore, a structure in which the first and second patterned areas and the first through-hole 112b communicate with each other may be formed. With such a structure, the following process of simultaneously charging a metal material into the first and second patterned areas and the first through-hole 112b may be easily performed.

As the metal material is simultaneously charged into the first and second patterned areas and the first through-hole 112b, the vertical wiring 113 may be formed in first through-hole 112b and the first patterned area, and the horizontal wiring 114 may be formed in the second patterned area. Through the process of charging the metal material, in the unit anodic oxide film wiring board 10', a first top layer part TL1 and a second top layer part TL2 may be formed, the first top layer part TL being provided on the bottom surface of the anodic oxide film 112 and including the respective vertical wirings 113 and the first junction layer 150 provided around the vertical wirings 150, the second top layer part TL2 being provided on the top surface of the anodic oxide film 112 and including the respective horizontal wirings 114 and the second junction layer 160 provided around the horizontal wirings 114.

On the other hand, the vertical wiring 113 and the horizontal wiring 114 may be individually formed.

When the vertical wiring 113 and the horizontal wiring 114 are individually formed, the vertical wiring 113 may be formed by a process of forming the first through-hole 112b and then charging the metal material into the first through-hole 112b. The second junction layer 160 may be then provided and patterned to form the second patterned area, and the metal material may be charged into the second patterned area, thereby forming the horizontal wiring 114 to be connected to the vertical wiring 113.

The vertical wiring 113 and the horizontal wiring 114 may be simultaneously formed or may be individually formed and then connected to each other. However, when the second junction layer 160 is first provided on the anodic oxide film 1 and then the first junction layer 150 is provided under the same, since a structure in which the first and second patterned areas and the first through-hole 112b communicate with each other may be formed, it is preferable that a process of simultaneously forming the vertical wiring 113 and the horizontal wiring 114 by simultaneously charging the metal material thereinto is performed. As described above, the unit anodic oxide film wiring board 10' may be manufactured in a more efficient manner depending on the structure of the anodic oxide film wiring board 10'.

By performing the above process, the unit anodic oxide film wiring board 10' constituting the anodic oxide film wiring board 110' may be realized as illustrated in FIG. 9A.

In the unit anodic oxide film wiring board 10', a space for providing a solder 180 may be formed by each of the first and second bonding layers 150 and 160 as in the unit anodic oxide film wiring board 10 according to the third embodiment. Therefore, the vertical wiring 113 and the horizontal wiring 114 of different layers may be joined to each other. In detail, the solder 180 may be provided in each of the first and second patterned areas in which the horizontal wiring 114 is provided. Therefore, each of the first and second junction layers 150 and 160 may simultaneously perform a function as mask capable of providing a space for forming each of the vertical wiring 113 and the horizontal wiring 114, a function of joining different unit anodic oxide film wiring boards 10', and a function of providing a space for the solder 180. In addition, each of the first and second junction layers 150 and 160 may perform a dam function around each of the first and second patterned areas thereby preventing overflow of the solder 180.

As illustrated in FIGS. 7A and 7B, the solder 180 may be provided as the cover-shaped solder 180a or the island-shaped solder 180b or may be provided in a suitable shape, so that the vertical wiring 113 and the horizontal wiring 114 of different layers may be joined to each other without a gap.

As an example, the unit anodic oxide film wiring board 10' as illustrated in FIG. 9A may be provided in an inversed shape to constitute the multilayer wiring board 100 according to the fifth embodiment as illustrated in FIG. 9B. In this case, the structure of the unit anodic oxide film wiring boards 10' illustrated in FIG. 9B may be illustrated as an example. The unit anodic oxide film wiring boards 10' may be provided in a structure suitable for compensating for a difference in pitch between vertical wirings 113 of the respective anodic oxide film wiring boards 10' having the vertical wirings 113 arranged at different pitches.

As illustrated in FIG. 9B, the anodic oxide film wiring board 100' constituting the multilayer wiring board 100' according to the present disclosure may be formed by stacking the plurality of unit anodic oxide film wiring boards 10' from top to bottom, each of the unit anodic oxide film wiring boards 10' including a body part BD including the respective vertical wirings 113 provided in the first through-holes 112b, the first top layer part TL1 provided on at least one surface of the body part BD and including the vertical wirings 113 and the first junction layer 150 provided around the vertical wirings 113, and the second top layer part TL2 provided on the other surface of the body part BD and including the horizontal wirings 114 and the second junction layer 160 provided around the horizontal wirings 114.

The unit anodic oxide film wiring board 10' constituting the fifth embodiment may have the first and second junction layers 150 and 160 respectively provided on and under the anodic oxide film 112, so that the area joined by the junction layers (specifically, the first and second junction layers 150 and 160)) in the stacked structure of the unit anodic oxide film wiring boards 10' may be increased. This may make it possible to manufacture the anodic oxide film wiring board 110' having excellent joining strength in terms of structure.

Referring to FIG. 9B, the anodic oxide film wiring board 110' constituting the fifth embodiment may be configured such that the area joined by the first and second junction layers 150 and 160 is larger than a junction area between metals (specifically, the vertical wirings 113 and the horizontal wiring 114). In other words, the remaining area except for the junction area between metals (the vertical wiring 113 and the horizontal wiring 114) may be composed of an area where the junction layer (specifically, at least one of the first and second junction layers 150 and 160) and metal are joined to each other, and an area where the junction layers (specifically, the first and second junction layers 5 and 6) are joined to each other. This may form a structure in which joining strength of the anodic oxide film wiring board 110' itself is further increased. Consequently, the anodic oxide film wiring board 110' having high durability may be realized.

A sintered ceramic wiring board 120 may be provided on the anodic oxide film wiring board 110' having such a structure and may be joined thereto by the first junction layer 150. In this case, the anodic oxide film wiring board 110' and the sintered ceramic wiring board 120 may have the same joining structure as that of the anodic oxide film wiring board 110'. In detail, the junction layer (specifically, the first junction layer 150) and the wiring (specifically, the vertical wiring 113) may be provided together on the same plane. With such a structure, the anodic oxide film wiring board 110' and the sintered ceramic wiring board 120 may be joined to each other without a gap. Consequently, the joining strength of the wiring boards 110' and 120 of different materials constituting the multilayer wiring board 100' may be increased.

By joining the anodic oxide film wiring board 110' and the sintered ceramic wiring board 120, the multilayer wiring board 100' may have a structure in which the sintered ceramic wiring board 120 is provided at a top portion thereof. This may prevent a problem in that a surface of the multilayer wiring board 100' where probes 190 are provided is dissolved by an alkaline solution used in a MEMS process for providing the probes 190. In other words, in the present disclosure, with a structure in which the top portion of the multilayer wiring board 100' where the probes 190 are provided is composed of the sintered ceramic wiring board 120, and the remaining portion is composed of the anodic oxide film wiring board 110', the multilayer wiring board 100' may have both durability and chemical resistance.

Figure 10:
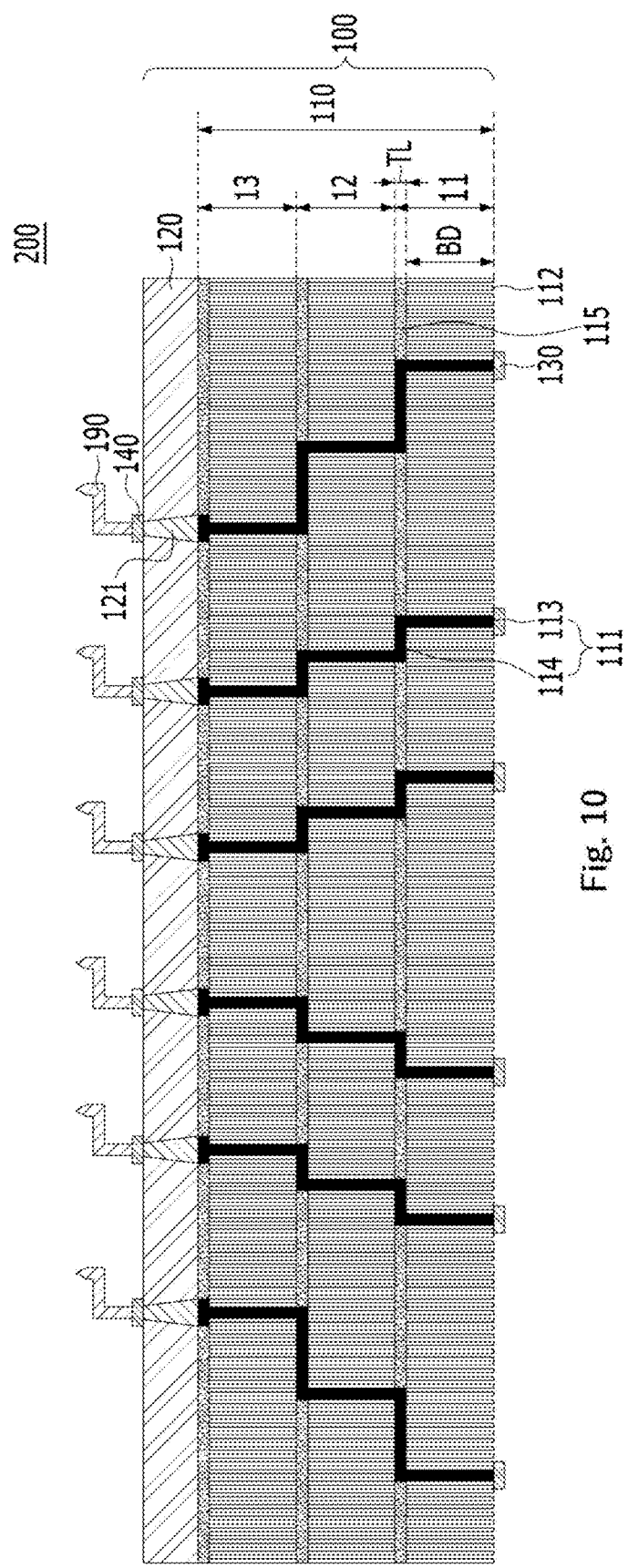
FIG. 10 is a view illustrating a probe card including the multilayer wiring board according to the present disclosure.

FIG. 10 is a view illustrating a probe card 200 including the multilayer wiring boards 100 according to the third and fourth embodiments. In this case, in FIG. 10, as an example, although it is illustrated that the multilayer wiring board 100 according to the fourth embodiment is provided on the probe card 200, the multilayer wiring board 100' according to the fifth embodiment may be provided on the probe card 200 to constitute the probe card 200 having both durability and chemical resistance.

Depending on the structure of installing the probes 190 on the multilayer wiring board 100 and the structure of the probe card 200, the probe card 200 may be divided into a vertical type probe card, a cantilever type probe card, a MEMS probe card 200. In the present disclosure, as an example, it will be described that the multilayer wiring board 100 is provided on the MEMS probe card 200 in which a process of providing the probes 190 is performed on the multilayer wiring board 100. It is preferable that the multilayer wiring board 100 according to the present disclosure is provided on a probe card having the probes 190 provided by performing a MEMS process on the multilayer wiring board 100.

As illustrated in FIG. 10, the probe card 200 according to the present disclosure may include: an anodic oxide film wiring board 110 made of an anodic oxide film 112 and including a first wiring 111; a sintered ceramic wiring board 120 made of a sintered ceramic material, including a second wiring 121 electrically connected to the first wiring 111, and joined to the anodic oxide film wiring board 110 so that the sintered ceramic wiring board 120 and the anodic oxide film wiring board 110 are joined to each other from top to bottom; a first connection pad 130 provided under the anodic oxide film wiring board 110; a second connection pad 140 provided on the sintered ceramic wiring board 120; and the probes 190 electrically connected to the second connection pad 140.

As illustrated in FIG. 10, as an example, the probe card 200 may include the multilayer wiring board 100 having a structure in which the sintered ceramic wiring board 120 is joined to a top portion of the anodic oxide film wiring board 110 composed of first to third unit anodic oxide film wiring boards 11, 12, and 13.

In the multilayer wiring board 100, the anodic oxide film wiring board 110 and the sintered ceramic wiring board 120 may be joined to each other by a structure in which a junction layer 115 provided between the anodic oxide film wiring board 110 and the sintered ceramic wiring board 120, and horizontal wirings 114 are provided on the same plane. Therefore, the wiring boards 110 and 120 made of different materials may be joined to each other without a gap, so that the joining strength of the multilayer wiring board 100 made of different materials may be increased. In addition, with a structure in which the anodic oxide film wiring board 110, which is formed by joining a plurality of unit anodic oxide film wiring boards 11, 12 and 13 in the same structure as that of joining the anodic oxide film wiring board 110 and the sintered ceramic wiring board 120, supports the sintered ceramic wiring board 120 on a top surface thereof, durability may be further increased in terms of structure.

The multilayer wiring board 100 provided on the probe card 200 according to the present disclosure may have the sintered ceramic wiring board 120 on the top portion thereof, so that the top surface may be made of a sintered ceramic material. Therefore, a surface with high chemical resistance to an alkaline solution may be formed. Consequently, when the probes 190 are manufactured by the conventional MEMS process, the probes 190 may be provided without a problem of dissolution of the multilayer wiring board 100.

As described above, with the provision of the multilayer wiring board 100, the probe card 200 according to the present disclosure may have the advantages of preventing thermal deformation of the anodic oxide film, realizing a fine pitch of the through-holes, durability due to a structure having excellent joining strength, and chemical resistance of the sintered ceramic material.

In addition, the wiring boards 110 and 120 of different materials constituting the multilayer wiring board 100 may be formed in a structure suitable for providing a low-resistance metal material. Therefore, the probe card 200 according to the present disclosure including the multilayer wiring board 100 may be increased in reliability in terms of electric signal propagation during an electrical test.

Although the exemplary embodiments of the present disclosure have been described for illustrative purposes, those skilled in the art will appreciate that various modifications, additions, and substitutions are possible, without departing from the scope and spirit of the disclosure as defined by the appended claims.

What is claimed is:

1. A multilayer wiring board, comprising:
   a multilayer part including:
   a first wiring layer made of an anodic oxide film and having a first wiring; and
   a second wiring layer having a second wiring electrically connected to the first wiring, the second wiring layer being made of a different material from that of the first wiring layer and being provided on at least one surface of the first wiring layer,
   wherein the first wiring layer is configured to be an anodic oxide film wiring board,
   wherein the second wiring layer is configured to be a sintered ceramic wiring board made of a sintered ceramic material, and joined to the anodic oxide film wiring board so that the sintered ceramic wiring board and the anodic oxide film wiring board are joined to each other from top to bottom, and
   wherein the anodic oxide film wiring board is formed by stacking a plurality of unit anodic oxide film wiring boards from top to bottom, each of the unit anodic oxide film wiring boards including a body part having a vertical wiring provided in a first through-hole, and a first top layer part provided on at least one surface of the body part and having a first horizontal wiring and a first junction layer provided around the first horizontal wiring.

2. The multilayer wiring board of claim 1, wherein a thin film layer is provided on at least one surface of the first wiring layer.

3. The multilayer wiring board of claim 1, further comprising:
   a third wiring layer provided over at least one surface of the first wiring layer and made of a different material from those of the first wiring layer and the second wiring layer.

4. The multilayer wiring board of claim 1, wherein the sintered ceramic wiring board is a wiring board formed by sintering a ceramic green sheet including alumina powder or mullite powder at high temperature.

5. The multilayer wiring board of claim 1, wherein each of the first and second wirings is a low-resistance metal material including Ag, Cu, Au, Pd, and Pt.

6. The multilayer wiring board of claim 1, wherein the unit anodic oxide film wiring boards are joined to each other by a junction layer.

7. The multilayer wiring board of claim 6, wherein the junction layer is made of a photosensitive material.

8. The multilayer wiring board of claim 1, wherein the each of the unit anodic oxide film wiring boards further includes a second top layer part provided on the other surface of the body part and having a second horizontal wiring and a second junction layer provided around the second horizontal wiring.

9. The multilayer wiring board of claim 1, further comprising:
   a first connection pad provided on the anodic oxide film wiring board;
   a second connection pad provided under the sintered ceramic wiring board; and
   a probe electrically connected to the first connection pad.

* * * * *